US012384141B2

(12) United States Patent
Power et al.

(10) Patent No.: US 12,384,141 B2
(45) Date of Patent: Aug. 12, 2025

(54) MANUFACTURING A TWO-SIDED PRODUCT WITH AN INTEGRATED DEVICE INCLUDING MICROSCALE STRUCTURES

(71) Applicant: CCL Secure Pty Ltd, Craigieburn (AU)

(72) Inventors: Gary Power, Craigieburn (AU); Patrick Swift, Craigieburn (AU); Ben Stevens, Craigieburn (AU)

(73) Assignee: CCL Secure Pty Ltd, Craigieburn (AU)

( * ) Notice: Subject to any disclaimer, the term of this patent is extended or adjusted under 35 U.S.C. 154(b) by 714 days.

(21) Appl. No.: 16/906,365

(22) Filed: Jun. 19, 2020

(65) Prior Publication Data

US 2020/0346396 A1 Nov. 5, 2020

Related U.S. Application Data

(63) Continuation of application No. PCT/AU2018/051361, filed on Dec. 19, 2018.

(30) Foreign Application Priority Data

Dec. 22, 2017 (AU) ................ 2017905173

(51) Int. Cl.
*B41M 3/14* (2006.01)
*B41F 5/06* (2006.01)
(Continued)

(52) U.S. Cl.
CPC ............ *B41F 5/06* (2013.01); *B41F 11/02* (2013.01); *B41F 13/025* (2013.01); *B41F 19/02* (2013.01);
(Continued)

(58) Field of Classification Search
None
See application file for complete search history.

(56) References Cited

U.S. PATENT DOCUMENTS 5,752,442 A * 5/1998 Johnson .................. B41F 23/00
101/154
2009/0145314 A1* 6/2009 Botrie ..................... B41F 23/08
101/170
(Continued)

FOREIGN PATENT DOCUMENTS

GB 2542243 A 3/2017
GB 2551092 A 12/2017
(Continued)

OTHER PUBLICATIONS

Article entitled "12 Gravure Printing" by Rozalia Szentgyorgyvolgyi, pp. 199-215; dated 2016. (Year: 2016).*
(Continued)

*Primary Examiner* — Leslie J Evanisko
(74) *Attorney, Agent, or Firm* — Fenwick & West LLP

(57) ABSTRACT

Apparatus for manufacturing a two-sided product with an integrated device on a web of material, including: a first rotary micro scale structure formation unit for having a first structure for forming a first microscale structure on one side of a portion of web; a second rotary microscale structure formation unit having a second structure for forming a second micro scale structure on second side of the portion of the web; the first and second micro scale structures and the portion of the web between the first and second microscale structures together forming the integrated device; and a web feed system for feeding the web of material between the first and second rotary microscale structure formation units.

19 Claims, 18 Drawing Sheets

(51) Int. Cl.
  *B41F 11/02* (2006.01)
  *B41F 13/02* (2006.01)
  *B41F 19/02* (2006.01)
  *B41M 1/04* (2006.01)
  *B41M 1/10* (2006.01)
  *B41M 1/24* (2006.01)
  *B41M 3/00* (2006.01)
  *B41M 7/00* (2006.01)
  *B42D 25/425* (2014.01)
  *B42D 25/29* (2014.01)

(52) U.S. Cl.
  CPC ............... *B41M 1/04* (2013.01); *B41M 1/10* (2013.01); *B41M 1/24* (2013.01); *B41M 3/008* (2013.01); *B41M 3/14* (2013.01); *B41M 7/0081* (2013.01); *B42D 25/425* (2014.10); *B41P 2200/12* (2013.01); *B42D 25/29* (2014.10)

(56) References Cited

U.S. PATENT DOCUMENTS

| | | |
|---|---|---|
| 2013/0069360 A1 | 3/2013 | Power et al. |
| 2014/0015909 A1 | 1/2014 | Leighton et al. |
| 2014/0367957 A1 | 12/2014 | Jordan |
| 2015/0061280 A1* | 3/2015 | Power ............... G02B 5/1828 264/1.36 |
| 2017/0080742 A1 | 3/2017 | Power |

FOREIGN PATENT DOCUMENTS

| | | | |
|---|---|---|---|
| WO | WO 2011/012800 A1 | 8/2011 | |
| WO | WO-2014118569 A1 * | 8/2014 | ............. B41M 3/14 |
| WO | WO 2017/009616 A1 | 1/2017 | |
| WO | WO 2017/088965 A1 | 6/2017 | |
| WO | WO 2018/153839 A1 | 8/2018 | |

OTHER PUBLICATIONS

PCT International Search Report, PCT Application No. PCT/AU2018/051361, Mar. 27, 2019, four pages.
Intellectual Property Office of the United Kingdom, Examination Report, United Kingdom Patent Application No. GB2009258.1, Nov. 3, 2021, two pages.
Intellectual Property Office of the United Kingdom, Third Party Observations, Submitted by Gill Jennings & Every LLP for United Kingdom Patent Application No. GB2009258.1, Dec. 11, 2020, seven pages.
National Industrial Property Institute of France, Office Action, French Patent Application No. FR1874049, Jul. 23, 2021, 18 pages.
Swedish Patent and Registration Office, Office Action, Swedish Patent Application No. 2050884-2, Dec. 18, 2023, eight pages.

* cited by examiner

MANUFACTURING A TWO-SIDED PRODUCT WITH AN INTEGRATED DEVICE INCLUDING MICROSCALE STRUCTURES

CROSS-REFERENCE TO RELATED APPLICATIONS

This application is a bypass continuation application of International PCT application No. PCT/AU2018/051361 filed on Dec. 19, 2018, which claims priority to Australian Patent application No. 2017905173 filed on Dec. 22, 2017, which are incorporated by reference herein in their entirety.

TECHNICAL FIELD

The invention relates generally to an apparatus and process for manufacturing a two-sided product with microscale structures formed on opposing surfaces of the product.

The invention is suitable for use in the manufacture of bank notes and like security documents with integrated security devices, and it will be convenient to describe the invention in relation to that exemplary, but non-limiting application.

BACKGROUND OF INVENTION

It is well-known that many of the world's bank notes as well as other security documents include micro-optic devices which produce optical effects enabling visual authentication of the bank note. Some of the micro-optic devices include focussing elements, such as micro-lenses, which act to magnify micro-imagery elements and project imagery which is observable by a user for authentication purposes.

Some existing bank notes rely upon the manufacture of a micro-optic device separately from the bank note substrate itself. Reasons for this include:
 a) The different speeds of the bank note substrate printing process, banknote design layer printing processes and the micro-optic device production process,
 b) The short lifetime of the tooling, such as shims or structure directly formed in the surface of a roller, used to create the lenses and the associated image layers in such micro-optic devices. Tooling used for the image layer can have a lifetime as short as 5000 linear meters in certain processes. At commercial speeds of printing security documents for certain processes, such as Gravure printing processes, this would require the printing process to stop every 20-40 minutes to change the tooling. This is not viable for a printing operation where set up times for registration can almost be equal to tooling life.
 c) The time required to obtain press registration versus the time that the lens manufacture process will run without attention or intervention.
 d) The ability to register the lens based device with the other areas of the security document.
 e) The unsuitability of traditional banknote printing techniques, such as sheet-fed intaglio and offset printing processes, to micro-optic device production process.

The multi stage processes currently deployed for the incorporation of lens-based micro-optic devices, and other microscale structures, into bank note substrates and like security documents creates higher levels of waste than is desirable. The order of magnitude differences in speed between the security document printing process and some lens manufacturing processes require many lens manufacturing processes to be in place to meet the need of only one security substrate manufacturing process.

It would be desirable to provide an in-line process for manufacturing a two-sided product bearing a microscale structure element on each side in which the microscale structure elements and the two-sided product were integrally formed. It would also desirable to provide an in-line process for manufacturing a two-sided product including a microscale structure element on each side that mitigates or alleviates known disadvantages or inconveniences of existing products.

SUMMARY OF INVENTION

One aspect of the invention provides apparatus for manufacturing a two-sided product with an integrated device on a web of material, including: a first rotary microscale structure formation unit having a first structure for forming a first microscale structure on one side of a portion of web; a second rotary microscale structure formation unit having a second structure for forming a second microscale structure on second side of the portion of the web; the first and second microscale structures and the portion of the web between the first and second microscale structures together forming the integrated device; and a web feed system for feeding the web of material between the first and second rotary microscale structure formation units.

In one or more embodiments, the first rotary microscale structure formation unit includes a first roller, having a first shim mounted thereto, the first structure being formed into a surface of the first shim.

In one or more embodiments, the first rotary microscale structure formation unit includes a first roller, having a first structure formed in a surface of the first roller.

In one or more embodiments, the first microscale structure is formed as a discrete patch on the web.

In one or more embodiments, the second rotary microscale structure formation unit includes a second roller, having a second shim mounted thereto, the second structure being formed into a surface of the second shim.

In one or more embodiments, the second rotary microscale structure formation unit includes a second roller, having a second structure formed in a surface of the second roller.

In one or more embodiments, the second microscale structure is formed as a discrete patch on the web.

In one or more embodiments, the apparatus further includes:
 a first printing station located prior to or forming part of the first rotary microscale structure formation unit for applying radiation curable ink to one side of the web, and embossing the first structure into the radiation curable ink to form the first microscale structure.

In one or more embodiments, the radiation curable ink is UV curable ink.

In one or more embodiments, the first printing station is a gravure printing unit.

In one or more embodiments, the apparatus further includes:
 one or more first radiation curing means for fixing the radiation curable ink after, or during, embossing the first structure.

In one or more embodiments, the first rotary microscale structure formation unit prints the first microscale structure on the web.

In one or more embodiments, the first rotary microscale structure formation unit includes a first ink application unit, preferably a flexographic printing unit, for applying radiation curable ink in one or more patches onto the first roller where the first microscale structure is to be formed.

In one or more embodiments, the radiation curable ink is coloured.

In one or more embodiments, the first roller rotates radiation curable ink such that the radiation curable ink is brought into contact with a portion of the web.

In one or more embodiments, the apparatus further includes:

one or more first radiation curing means for fixing the radiation curable ink when the radiation curable ink is in contact with the portion of the web to form the first microscale structure.

In one or more embodiments, the apparatus further includes:

a second printing station located prior to or forming part of the second rotary microscale structure formation unit for applying radiation curable ink to one side of the web, and embossing the second microscale structure into the radiation curable ink.

In one or more embodiments, the radiation curable ink is UV curable ink.

In one or more embodiments, the second printing station is a gravure printing unit.

In one or more embodiments, the apparatus further includes:

one or more second radiation curing means for fixing the radiation curable ink after, or during, embossing the second structure.

In one or more embodiments, the second rotary microscale structure formation units prints the second microscale structure on the web.

In one or more embodiments, the second rotary microscale structure formation unit includes a second ink application unit, preferably a flexographic printing unit, for applying radiation curable ink in one or more patches onto the second roller where the second microscale structure is to be formed.

In one or more embodiments, the radiation curable ink is coloured.

In one or more embodiments, the second roller rotates radiation curable ink such that the radiation curable ink is brought into contact with the portion of the web.

In one or more embodiments, the apparatus further includes:

one or more second radiation curing means for fixing the radiation curable ink when the one or more patches are in contact with the portion of the web to form the second microscale structure. In one or more embodiments, the apparatus further includes: a detector for detecting one or more registration marks or devices formed by the first and second rotary microscale structure formation units, components of the first and second rotary microscale structure formation unit, one or more additional microscale structure formation units or components of one or more additional microscale structure formation units; and a controller for determining a registration error, and controlling a registration compensation system to compensate determined registration error.

In one or more embodiments, the web travels in a machine direction though the apparatus, the registration compensation system including: a linear compensator to control registration in the machine direction, including and idler roller adapted to be driven transverse to the machine direction and to the plane of the web to increase or decrease web length between the first and second microscale structure formation units.

In one or more embodiments, the registration compensation system further includes: an edge guide to control registration transverse to the machine direction and in the plane of the web by moving the web sideways between its edges.

In one or more embodiments, the first and second rotary microscale structure formation units and/or one or more additional microscale structure formation units each include a main drum over which the web passes, the registration compensation system including a skew compensation means to adjust the relative skew angle between the web and the relevant microscale formation unit.

In one or more embodiments, the skew compensation means includes a skew roller prior to at least one of the main drums; and skew compensator to compensate for web skew by controlling relative pivoting between the skew roller and the main drum to alter web entry angle at the at least one main drum.

In one or more embodiments, the first and/or second structure includes an image area and a non-image area, wherein one or more ink-housing recesses are formed in the non-image area and ink-housing recesses are omitted from the image area, the shim thereby acting to print a negative or reverse image.

In one or more embodiments, the apparatus further includes: an automated shim mounting machine to automatically mount shims to form the microscale structures to desired tolerances.

In one or more embodiments, the apparatus further includes: a roller temperature control system including heat exchanger for transferring heat between rollers in one or both to the first and second microscale structure formation units and a cooling fluid; one or more temperature measuring devices for measuring the temperature of the rollers; and a control system for controlling operation of the heat exchanger is response to the temperature detected by the one or more temperature measuring devices.

In one or more embodiments, the apparatus further includes: an ink temperature control system for controlling the temperature of the radiation curable ink including one or more ink storage tanks; a heat exchanger for transferring heat between the ink storage tanks and a cooling fluid; one or more temperature measuring devices for measuring the temperature of the ink; and a control system for controlling operation of the heat exchanger is response to the temperature detected.

In one or more embodiments, the apparatus further includes: one or more print units, preferably gravure print units, located in-line with the first and second microscale structure formation units, and not associated with the production of the first and second microscale structures, for applying print layers to the two-sided product.

In one or more embodiments, one the first microscale structure forms any one of lenticular micro lenses, spherical micro lenses, micro mirrors, lenticular mirrors, diffractive zone plates and Fresnel lenses.

In one or more embodiments, the second microscale structure forms image elements that interact with the first microscale structure to form a moiré magnification device, an integral image device, or a lenticular image device.

In one or more embodiments, the web of material has a width greater than 600 mm and preferably greater than 800 mm.

In one or more embodiments, the two sided product is a security document.

In one or more embodiments, the security document is a bank note.

Another aspect of the invention provides a method for manufacturing a two-sided product with an integrated device on a web of material, including the steps of: using a first rotary microscale structure formation unit for having a first structure to form a first microscale structure on one side of a portion of web; using a second rotary microscale structure formation unit having a second structure to form a second microscale structure on second side of the portion of the web; the first and second microscale structures and the portion of the web between the first and second microscale structures together forming the integrated device; and using a web feed system to feed the web of material between the first and second rotary microscale structure formation units.

In one or more embodiments, the method further includes: using a first printing station located prior to or forming part of the first rotary microscale structure formation unit to apply one or more patches to one side of the web, and embossing the first structure into the one or more patches to form the first microscale structure.

In one or more embodiments, the method further including: using one or more first radiation curing means to fix the radiation curable ink after, or during, embossing the first structure.

In one or more embodiments, the first rotary microscale structure formation unit includes a first ink application unit, preferably a flexographic printing unit, the method further including: using the first ink application unit to apply radiation curable ink in one or more patches onto the first roller where the first microscale structure is to be formed.

In one or more embodiments, the method further includes: using the first roller to rotate the one or more patches such that the one or more patches are brought into contact with the portion of the web.

In one or more embodiments, the method further includes: using one or more first radiation curing means to fix the radiation curable ink when the one or more patches are in contact with the portion of the web to form the first microscale structure.

In one or more embodiments, the method further includes: using a second printing station located prior to or forming part of the second rotary microscale structure formation unit to apply one or more patches to one side of the web, and embossing the second microscale structure into the one or more patches.

In one or more embodiments, the method further includes: using one or more second radiation curing means for fixing the radiation curable ink after, or during, embossing the second structure.

In one or more embodiments, the method further includes: the second rotary microscale structure formation unit includes a second ink application unit, preferably a flexographic printing unit, the method further including: using the second ink application unit to apply radiation curable ink in one or more patches onto the second roller where the second microscale structure is to be formed.

In one or more embodiments, the method further includes: using the second roller to rotate the one or more patches such that the one or more patches are brought into contact with the portion of the web.

In one or more embodiments, the method further includes: using one or more second radiation curing means to fix the radiation curable ink when the one or more patches are in contact with the portion of the web to form the second microscale structure.

In one or more embodiments, the method further includes: using a detector to detect one or more registration marks or devices formed by the first and second rotary microscale structure formation units, components of the first and second rotary microscale structure formation unit, one or more additional microscale structure formation units or components of one or more additional microscale structure formation units; and using a controller to determine a registration error, and control a registration compensation system to compensate determined registration error.

In one or more embodiments, the web travels in a machine direction though the apparatus, the method further including: using a linear compensator forming part of the registration compensation system to control registration in the machine direction, including and idler roller adapted to be driven transverse to the machine direction and to the plane of the web to increase or decrease web length between the first and second microscale structure formation units.

In one or more embodiments, the method further includes: using an edge guide forming part of the registration compensation system to control registration transverse to the machine direction and in the plane of the web by moving the web sideways between its edges.

In one or more embodiments, the first and second rotary microscale structure formation units and/or one or more additional microscale structure formation units each include a main drum over which the web passes, the method further including: using a skew compensation means forming part of the registration compensation system to adjust the relative skew angle between the web and the relevant microscale formation unit.

In one or more embodiments, the skew compensation means includes a skew roller prior to at least one of the main drums, the method further including: using a skew compensator forming part of the skew compensation means to compensate for web skew by controlling relative pivoting between the skew roller and the main drum to alter web entry angle at the at least one main drum.

In one or more embodiments, the first and/or second structure includes an image area and a non-image area, the method further including: forming one or more ink-housing recesses in the non-image area, and omitting ink-housing recesses from the image area, the shim thereby acting to print a negative or reverse image.

In one or more embodiments, the method further includes: using an automated shim mounting machine to automatically mount shims to form the microscale structures to desired tolerances.

In one or more embodiments, the method further includes: in a roller temperature control system including a heat exchanger, one or more temperature measuring devices and a control system, using the heat exchanger to transfer heat between rollers in one or both to the first and second microscale structure formation units and a cooling fluid; use the one or more temperature measuring devices to measure the temperature of the rollers; and using the control system to control operation of the heat exchanger is response to the temperature detected by the one or more temperature measuring devices.

In one or more embodiments, the method further includes: in an ink temperature control system for controlling the temperature of the radiation curable ink, using a heat exchanger for transferring heat between ink storage tanks and a cooling fluid; using one or more temperature measuring devices to measure the temperature of the ink; and using a control system to control operation of the heat exchanger in response to the temperature detected.

In one or more embodiments, the method further includes: using one or more print units, preferably gravure print units, located in-line with the first and second microscale structure formation units, and not associated with the production of the first and second microscale structures, to apply print layers to the two-sided product.

One or more embodiments of the invention provide a process and apparatus for manufacturing two-sided products with integrated microscale structures formed on opposing surfaces of the products. One or more embodiments of the invention provide a process and apparatus for manufacturing two-sided products with integrated microscale structures formed on opposing surfaces of the two-sided products, wherein the microscale structures are formed in register and a radiation curable printing or embossing process is used in the formation of the microscale structures. In some cases, the microscale structures may form a micro-optic device typically used as an anti-counterfeit measure and/or be formed in-line with further printing processes.

BRIEF DESCRIPTION OF DRAWINGS

Preferred embodiments of the invention will now be described by way of example only with reference to the accompanying drawings in which.

DETAILED DESCRIPTION OF DRAWINGS

Figure 1:
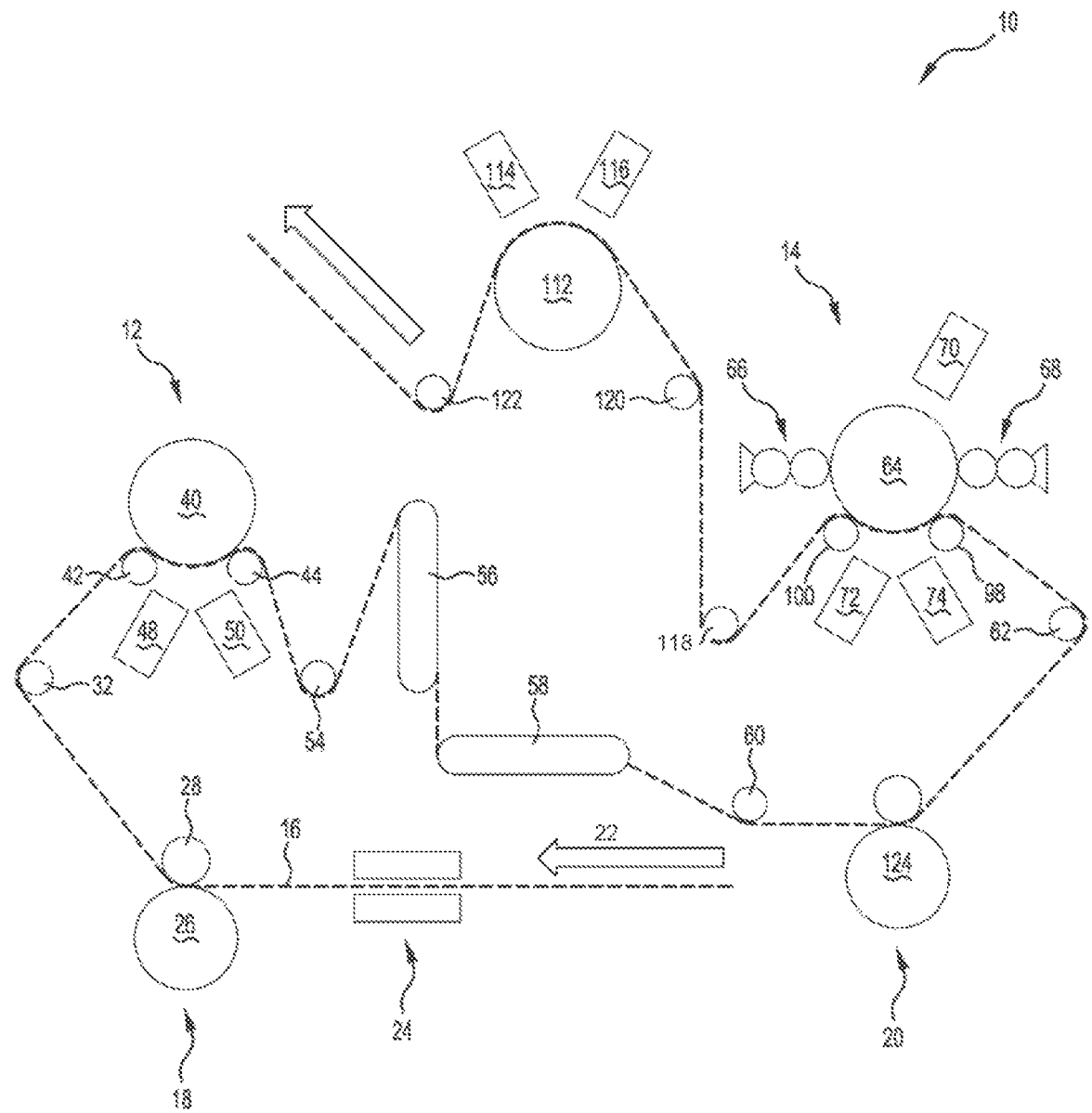
FIG. 1 is a schematic diagram of one embodiment of apparatus for manufacturing of a two-sided product, such as a banknote.

The invention is particularly, but not exclusively, applicable to security documents or tokens such as bank notes or identification documents such as Identity cards or passports formed from a substrate to which one or more layers of printing are applied.

More broadly, the invention is applicable to a micro-optic device which, in various embodiments, is suitable for visual enhancement of clothing, skin products, documents, labels, printed matter, manufactured goods, merchandising systems, packaging, points of purchase displays, publications, advertising devices, sporting goods, security documents and tokens, financial documents and transaction cards, and other goods.

Definitions

Security Document or Token

As used herein, the terms security documents and tokens includes all types of documents and tokens of value and identification documents including, but not limited to the following: items of currency such as bank notes and coins, credit cards, cheques, passports, identity cards, securities and share certificates, driver's licences, deeds of title, travel documents such as airline and train tickets, entrance cards and tickets, birth, death and marriage certificates, and academic transcripts.

Security Device or Feature

As used herein, the term security device or feature includes any one of a large number of security devices, elements or features intending to protect security document or token from counterfeiting, copying, alteration or tampering. Security devices or features may be provided in or on the substrate of the security document or in or on one or more layers applied to the base substrate, and may take a wide variety of forms such as security threads embedded in layers of the security document; security inks such as fluorescent, luminescent or phosphorescent inks, metallic inks, iridescent inks, photochromic, thermochromic, hydrochromic, or peizochromic inks; printed or embossed features including relief structures; interference layers; liquid crystal devices; lenses and lenticular structures; optically variable devices (OVDs) such as diffractive devices including diffraction gradients, holograms and diffractive optical elements (DOEs).

Microscale Structure

As used herein, the term microscale structure includes embossed or printed structures having a scale of physical consideration or of bounds having at least one characteristic dimension less than 999 μm (under 1 mm). More preferably, microscale structure refers to the ability to generate or print structures with a resolution below that of traditional industrial print units, such as Gravure, Offset (wet and dry), Flexographic, Intaglio and the like, both in both the plane of the substrate (or a plane parallel to the substrate) and a plane perpendicular to the substrate. Particularly, structures having at least one characteristic dimension less than 50 microns and, more preferably, structures having at least one characteristic dimension less than 10 microns, even more preferably, structures having at least one characteristic dimension less than 5 microns.

The lower limit of structure size is set by the current origination technology limits. As such, the term microscale structure includes structures having one characteristic dimensions of less than 1 micron, such as for example, diffraction gratings with a period of 400 nm.

Wide Web

In the printing industry, web printing generally falls into two categories: narrow web; and wide web. Although there is not a standard width which defines the gap between narrow web and wide web, generally, narrow web apparatus, particularly printing machines, handle web widths of around 300 mm, although some scaled up narrow web machines can handle up to 600 mm. Wide web apparatus is, generally, at widths greater than 600 mm and preferably widths above 800 mm. Wide web printing is capable of higher speeds but requires greater control of registration, particularly in the machine direction and skew, due to the length of the web and width of the web respectively.

Substrate

As used herein, the term substrate refers to the base material from which the security document or token is formed. The base material may be paper or other fibrous materials such as cellulous; a plastic or polymeric material including but not limited to polypropylene (PP), polyethylene (PE), polycarbonate (PC), polyvinyl chloride (PVC), polyethylene terephthalate (PET), biaxially-oriented polypropylene (BOPP); or a composite material of two or more materials, such as a laminate of paper and at least one plastic material, or of two or more polymeric materials.

Transparent Windows and Half Windows

As used herein, the term window refers to a transparent or translucent area in the security document compared to opaque regions to which printing is, typically, applied. The window maybe fully transparent so as to allow the transmission of light substantially unaffected, or it may be partly transparent or translucent, partly allowing the transmission of light but without allowing objects to be seen clearly through the window area.

A window area may be formed in a polymeric security document which has at least one layer of transparent polymeric material and one or more opacifying layers applied to at least one side of a transparent polymeric substrate, by omitting at least one opacifying layer in the region forming the window area. If opacifying layers are applied to both sides of a transparent substrate, a fully transparent window may be formed by omitting the opacifying layers on both sides of the transparent substrate in the window area.

A partly transparent or translucent area herein after referred to as a "half-window", may be formed in a polymeric security document which has opacifying layers on both sides by omitting the opacifying layers on one side only of the security document in the window area so that "half-window" is not fully transparent but allows sunlight to pass through without allowing objects to be viewed clearly through the half-window.

Alternatively, it is possible for the substrates to be formed from a substantially opaque material, such as paper or fibrous material, without an insert of transparent plastics material inserted into a cut out or recessed into the paper or fibrous substrate to form a transparent window or a translucent half-window area.

Windows and Half Windows, typically, include one or more security features, which may include embossed designs, printed vignettes, diffractive features, micro-optical features, amongst others.

Opacifying Layers

One or more opacifying layers may be applied to a transparent substrate to increase the opacity of the security document. An opacifying layer is such that $L_T<L_0$ where $L_0$ is the amount of light incident on the document, and $L_T$ is the amount of light transmitted through the document. An opacifying layer may comprise any one or more of a variety of opacifying coatings. For example, the opacifying coatings may comprise a pigment, such as titanium dioxide, dispersed within a binder or carrier of heat-activated cross-linkable polymeric material. Alternatively, a substrate of transparent plastic material could be sandwiched between opacifying layers of paper or other partially or substantially opaque material to which indicia may be subsequently printed or otherwise applied.

Focusing Elements

One or more focusing elements may be applied to the substrate of the security device. As used herein, the term "focusing element" refers to elements and devices that focus light towards or cause light to constructively interfere at a real focal point. Focusing elements include refractive elements that focus incoming light to a real focal point in a real focal plane and also collimate light scattered from any point in the focal plane to a particular direction. Focusing elements also include transmissive diffractive lenses, zone plates and the like that cause transmitted diffracted light to constructively interfere at a desired real focal point.

Radiation Curable Ink

The term radiation curable ink used herein refers to any ink, lacquer or other coating which may be applied to the substrate in a printing process, and which can be printed or embossed while soft, or semi-soft, to form a relief structure and cured by radiation to fix the relief structure. The curing process, typically, does not take place before the radiation curable ink is printed or embossed, but it is possible for the ink to be partially cured (semi-soft), in some processes, before printing or embossing and also for the curing process to take place either after printing or embossing or at substantially the same time as the printing or embossing step. The radiation curable ink is preferably curable by ultraviolet (UV) radiation. Alternatively, the radiation curable ink may be cured by other forms of radiation, such as electron beams or X-rays. References to UV curable ink(s) in the remainder of the description are by way of example. All embodiments may be replaceable with other radiation curable inks, as long as they can meet the criteria required by the embodiment (such as viscosity prior to curing). Similarly, reference to UV lamps reflect that the description refers to UV curable inks. If an ink curable by electron beam is used, the, clearly, an electron beam device would be used instead of the UV lamps.

The radiation curable ink is preferably a transparent or translucent ink formed from a clear resin material. Such a transparent or translucent ink is particularly suitable for printing light-transmissive security elements such as sub-wavelength gratings, transmissive diffractive gratings and lens structures.

The transparent or translucent ink preferably comprises an acrylic based UV curable clear lacquer or coating. Such UV curable lacquers can be obtained from various manufacturers, including Kingfisher Ink Limited, product ultraviolet type UVF-203 or similar. Alternatively, the radiation curable ink may be based on other compounds, eg nitro-cellulose.

The radiation curable inks and lacquers used herein have been found to be particularly suitable for printing or embossing microstructures, including diffractive structures such as diffraction gratings and holograms, and microlenses and lens arrays. However, they may also be printed or embossed with larger relief structures, such as non-diffractive optically variable devices.

The ink is preferably printed or embossed and cured by ultraviolet (UV) radiation at substantially the same time.

Preferably, in order to be suitable for Gravure printing, which is the preferred method of applying the radiation curable ink when it is subsequently embossed, the radiation curable ink has a viscosity falling substantially in the range from about 20 to about 175 centipoise, and more preferably from about 30 to about 150 centipoise. The viscosity may be determined by measuring the time to drain the lacquer from a Zahn Cup #2. A sample which drains in 20 seconds has a viscosity of 30 centipoise, and a sample which drains in 63 seconds has a viscosity of 150 centipoise.

With some polymeric substrates, it may be necessary to apply an intermediate layer to the substrate before the radiation curable ink is applied to improve the adhesion of the structure formed by the ink to the substrate. The intermediate layer preferably comprises a primer layer, and more preferably the primer layer includes a polyethylene imine. The primer layer may also include a cross-linker, for example a multi-functional isocyanate. Examples of other primers suitable for use in the invention include: hydroxyl terminated polymers; hydroxyl terminated polyester based co-polymers; cross-linked or uncross-linked hydroxylated acrylates; polyurethanes; and UV curing anionic or cationic acrylates. Examples of suitable cross-linkers include: isocyanates; polyaziridines; zirconium complexes; aluminium acetylacetone; melamines; and carbodi-imides.

FIG. 1 shows an exemplary apparatus 10 for the manufacture of a two-sided product with an integrated device, having at least one microscale structure on each side, on a web of material and, particularly, an apparatus capable of printing "wide web" material. The apparatus 10 includes a first rotary microscale structure formation unit 12 and a second rotary microscale structure formation unit 14 between which a web 16 of material is passed. The first and second rotary microscale structure formation units 12 and 14 are adapted to form microscale structures on opposing sides of the web 16. The first and second microscale structures and the portion of the web between the first and second microscale structures together form the integrated device.

As stated above, in the context of this disclosure, the words "first" and "second" are neither intended to covey the sense in which the web is fed nor the sequence in which any of the microscale structures is formed. The words "first" and "second" are intended to distinguish like named elements from each other.

It should also be appreciated that, the embodiments described below refer to the use of a UV curable ink. In general, other radiation curable inks may be used as a substitute for a UV curable ink, although UV curable inks are the preferred type of radiation curable ink.

In the embodiment depicted in FIG. 1, the first rotary microscale structure formation unit 12 comprises a micro-lens embossing unit in which a shim is used. The second rotary microscale structure formation unit 14 comprises two flexographic print units mounted to a drum which bears a shim. The flexographic print units apply a radiation curable ink, which in the examples below is a UV curable ink, to the shim, in the same manner as traditional printing units. The flexographic print units, together with an optional upstream gravure print unit 20, provide UV curable ink in a desired pattern and/or colour in order to form an imagery layer on the opposite side of the web to the micro-optic lenses.

The micro-optic lenses cause incident light to be focussed on the imagery layer through a transparent or partially transparent portion of the web 16 in order to project imagery which is observable to the user. However, in other embodiments, the microscale structures formed on opposing sides of the web 16 may have a variety of forms. The rotary microscale structure formation units 12 and 14 each are adapted to form microscale structures acting as focussing elements or image elements. Focussing elements may include a number of refractive or reflective structures including micro-lenses or micro-mirrors, as well as diffractive structures including binary or multi-level zone plates.

The microscale structures may be formed by the application of ink or other material to the web 16. The choice of microscale structure applied to the web 16 by the rotary microscale structure formation units 12 and 14 will depend upon the nature of the device that is intended to be integrally formed with the two-sided product to be manufactured by the apparatus 10.

Furthermore, whilst the embodiment depicted in FIG. 1 shows two rotary microscale structure formation units, additional rotary microscale structure formation units may be used in other embodiments of the apparatus for manufacture of a two-sided product. It should also be understood that the specific details of each rotary microscale structure formation unit, such as the number of printing stations, rollers, UV curing lamps and other devices, may vary according to the properties of one or both of the microscale structures applied to opposing sides of the web 16.

The apparatus 10 further includes a web feed system for feeding the web 16 of material between the first and second rotary microscale structure formation units 12 and 14. The web feed system can include web cleaner units, gravure units, skew rollers, linear compensators, edge guides, guide rollers, feed rollers, and the like.

Figure 2:
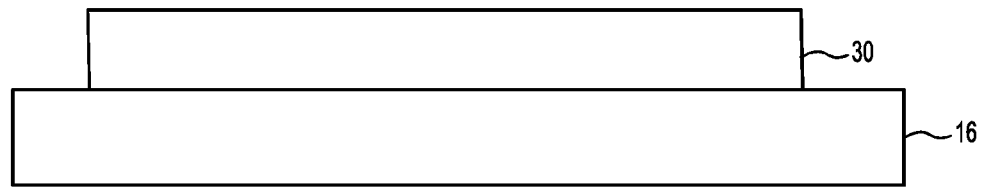
FIGS. 2, 4, 5 and 7 to 10 are schematic diagrams of one embodiment of a two-sided product during various stages of manufacture by the apparatus shown in FIG. 1.

In use, the web 16 is fed in a direction 22 through a web cleaner unit 24 to the gravure print unit 18. The gravure print unit 18 includes a gravure cylinder 26 acting in cooperation with a gravure impression roller 28. As can be seen in FIG. 2, the gravure cylinder 26 and gravure impression roller 28 act to apply a patch 30 of UV curable ink to the web 16.

Figure 3:
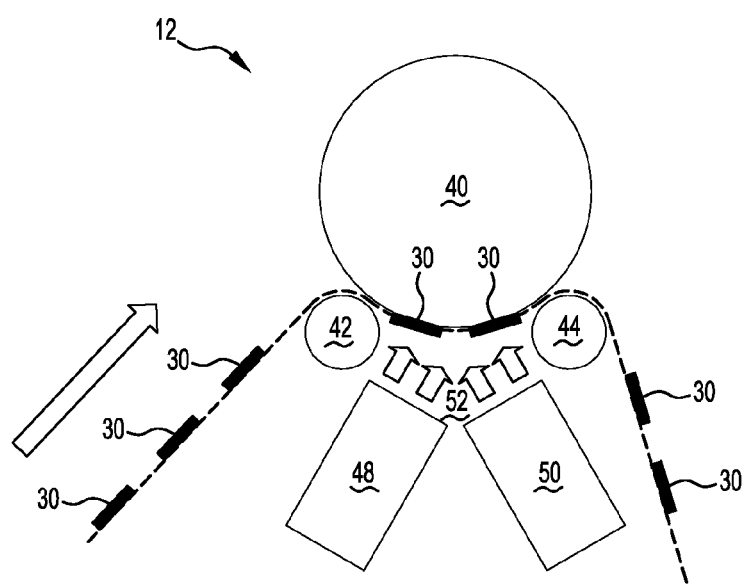
FIGS. 3 and 6 are schematic diagrams respectively of first and second rotary microscale structure formation units forming part of the apparatus shown in FIG. 1.
Figure 4:
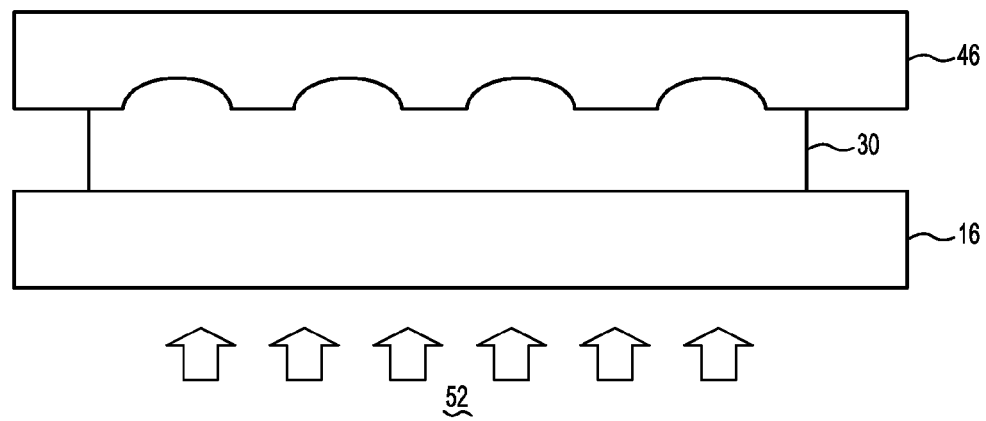

After passing around a skew roller 32 (see FIG. 1) which can be adjusted to control the skew of the web 16 relative to the first rotary microscale structure formation unit 12, the web 16 is fed to the first rotary microscale structure formation unit 12. As can be seen in FIG. 3, patches 30 of UV curable ink are pressed against a main drum 40 and the web 16 by entry and exit rollers 42 and 44. A shim 46 (see FIG. 4) is mounted to the main drum 40, as described in greater detail below, so that upon rotation of the main drum 40 and entry and exit rollers 42 and 44, the shim 46 presses against the clear UV layer 30 to emboss a microscale structure in the form of micro-lenses, or other light focusing elements.

Figure 5:
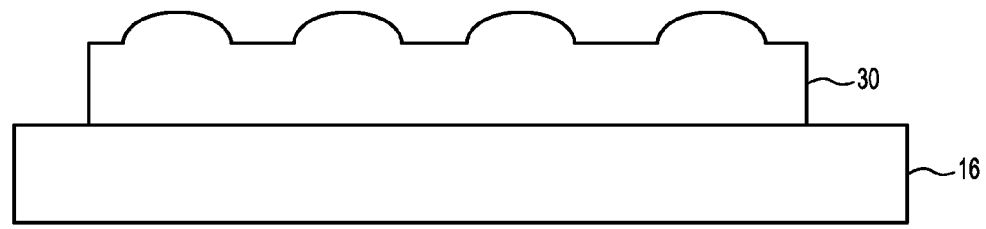

The rotary microscale structure formation unit 12 further includes UV lamps 48 and 50 to provide curing energy 52 to fix the UV curable ink, in the shape of the structures on the shim 46, when the shim is in contact with the UV curable ink 30. When released from the shim 46 upon rotation of the main drum 40 and exit of the web 16 from the first rotary microscale structure formation unit 12, each patch 30 of material retains its cured form, as depicted in FIG. 5.

After leaving the first rotary microscale structure formation unit 12, the web 16 passes across a guide roller 54, or series of rollers, and is then directed to a linear compensator 56 and edge guide 58 to provide adjustments to the web 16 for registration between the first rotary microscale structure formation unit 12 and downstream devices, including the second rotary microscale structure formation unit 14.

After exiting the edge guide 58, the web 16 passes over a guide roller 60, or series of rollers, and is fed to the gravure print unit 20. This gravure print unit 20 delivers a UV curable patch of ink onto the web 16 on the opposite side to the patch applied by the upstream gravure cylinder 26. The application of a UV curable ink patch by gravure print unit 20 enables a "wetting" layer to be applied to the web for UV curable processes. That is, an uncured UV curable ink patch, being soft or wet, is applied in advance of the second rotary microscale structure formation unit 14. A wetting layer reduces the chances of defects in the formed microscale structure, such as bubbles. Some structure designs are more susceptible to bubble formation that others, so it should be understood that this gravure print unit 20 is optional.

The web 16 is then fed from the gravure print unit 20 to a skew roller 62 which can be adjusted to control the skew of the web to the second rotary microscale structure formation unit 14.

Figure 6:
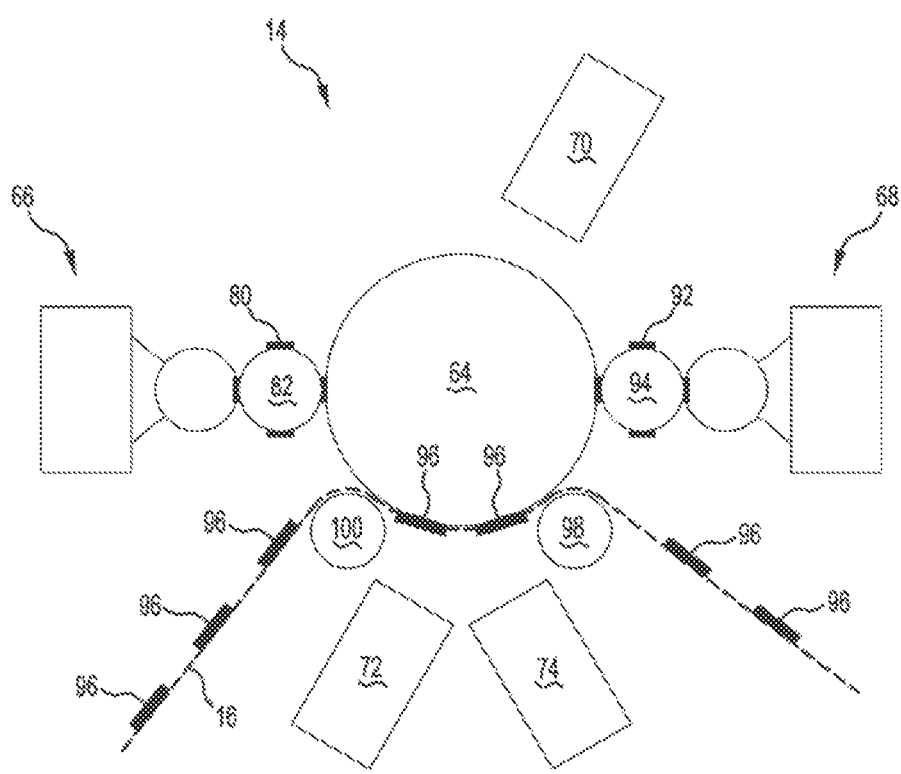
Figure 7:
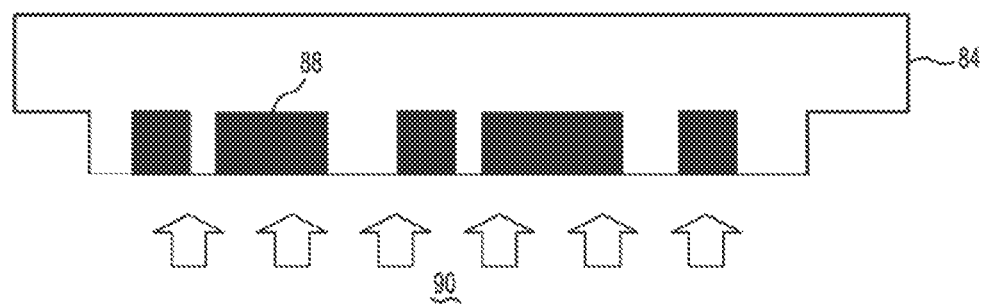

The second rotary microscale structure formation unit 14 acts to apply an imaging microscale structure to the opposite side of the web 16 to which the micro-lenses are applied, as shown in more detail in FIG. 6. The second rotary microscale structure formation unit 14 includes a main drum 64 and, in this embodiment, two flexographic print units 66 and 68.

The flexographic printing units 66 and 68 apply UV curable ink directly to a shim mounted to the main drum 64, in the same manner as traditional printing units. The main drum 64 then prints the UV curable ink applied by the flexographic printing units 66 and 68 to the web 16. A UV lamp 70 can provide a part, or full, cure for the flexographic print unit 66 but otherwise all UV curable ink is cured using UV lamps 72 and 74. The combination of the gravure print unit 20 and the flexographic print units 66 and 68 forming part of the second rotary microscale structure formation unit 14 can together provide the UV curable ink in any desired pattern or colour on the shim.

For example, the flexographic printing unit 66 may provide UV curable ink of one colour (colour includes clear ink in this context) in one or more first regions of the shim and the flexographic printing unit 68 may provide UV curable ink of another colour in one or more second regions of the shim. In the case where the flexographic units 66, 68 are providing UV curable ink at, at least, some different locations on the shim (on drum 64), it is preferable to swap the locations of the UV lamp 70 with the flexographic unit 68. As a result, it will be possible to part, or fully, cure the UV curable ink from both flexographic units 66, 68, as the UV lamp 70 would be located after application of the UV curable ink on to the shim but before printing to the web 16. The first and second regions can be at separate discrete locations or some may be overlapped. The gravure print unit 20 can also provide UV curable ink of a third colour onto the web which will correspond to one or more third regions on the shim. In this case, as the UV curable ink is applied to the web by gravure print unit 20 before reaching the microscale structure formation unit 14, the structures on the shim are embossed into the UV curable ink rather than the shim printing the structures onto the web, as is the case with the UV curable ink applied by the flexographic print units 66, 68.

Once again, the third regions can be located in discrete locations, separate from the first and or second regions, or overlapped with one or both. That is, when used in combination, the flexographic print units 66, 68 and gravure print unit 20 can be utilised to generate microscale structures having three different UV curable inks. Notably, in alternative embodiments, each of the flexographic print units 66, 68 and gravure print unit 20 can be used separately, without any other print unit being utilised, or in combination with other of the print units to generate microscale structures.

In one embodiment of operation, the flexographic printing unit 66 applies patches 80 of pigmented UV curable ink to a transfer roller 82. The transfer roller 82 causes the patches to bear against the main drum 64, such that the ink is applied to a shim 84. The patches are transferred to the shim 84 in regions in which the shim 84 has recesses in which microscale structures formed, such that the ink fills the recesses. The ink 88 in the recesses of the shim 84 remains in the shim as the main drum 64 rotates towards the UV lamp 70. At the UV lamp 70, curing energy 90 is applied to partially, or fully, cure the ink 88 in the recesses of the shim 84.

Figure 8:

The flexographic printing unit 68 applies patches 92 of clear UV curable ink to a transfer drum 94 for subsequent transfer to the ink bearing shim. FIG. 8 depicts the resulting structure. As the drum 64 further rotates, the structure depicted in FIG. 8 is brought into contact with a patch of ink 96 applied to the web 16 by the gravure printing unit 20. The web 16 is fed to the main drum 64 in cooperation with an entry impression roller 98, and moved away from the rotary microscale structure formation unit 14 by means of an exit impression roller 100.

Figure 9:
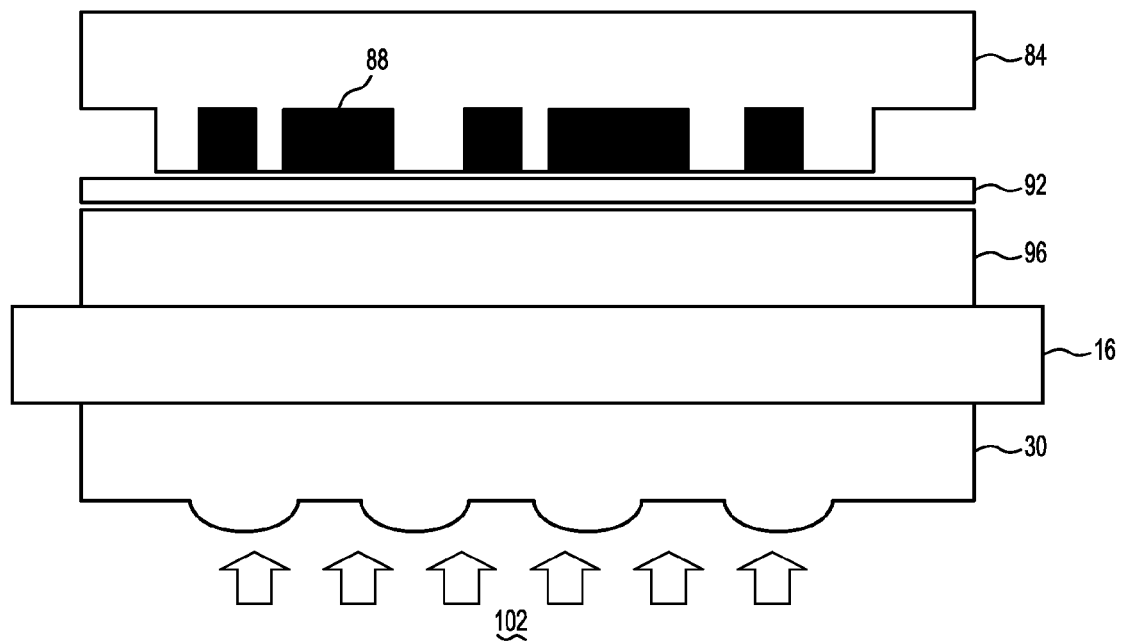

The resulting structure, including patches 92 and 96 applied respectively by the flexographic printing unit 68 and the gravure printing unit 20, and the ink 88 in the recesses of the shim 84, are then carried on the web 16 past the UV lamps 72 and 74 in the manner shown in FIG. 9. Once again, curing energy 102 is applied from the UV lamps 72 and 74 to cure the ink elements 88 and patches 92 and 96 together.

Figure 10:
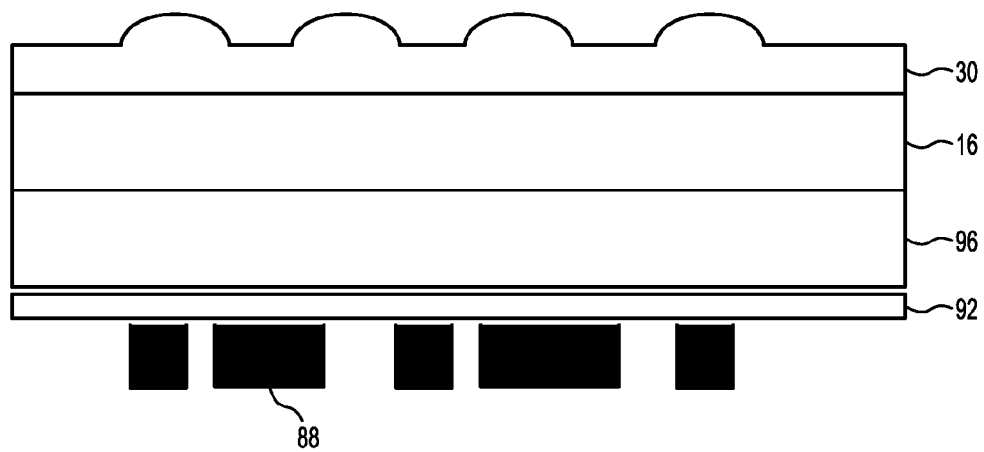

Upon continued rotation of the main drum 64, the web and the structure consisting of the ink elements 88 and patches 92 and 96 separates from the shim 84 (which remains on the main drum). FIG. 10 depicts the structure and web once it is released from the shim and the microscale structure forming printed image elements has been created.

In embodiments in which both flexographic print units 66 and 68 and the gravure printing units 18 and 20, are used, the weight of UV curable ink can be significant. In this case, a curing station 110 can be provided, including a drum 112 over which the web 16 is transported so as to apply curing energy from UV lamps 114 and 116. Guide rollers 118 and 120 guide the web 16 from the second rotary microscale structure formation unit 20 to the curing station 110.

A final guide roller 122 directs the web 116 to further downstream processing operations, such as opacification of the web 16, and inclusion of further security devices, the cutting of the web into sheets and the subsequent separation of the sheets into bank notes.

X-Y Registration System

Traditionally, microscale structures, and, particularly, two-sided microscale structures, are applied through post-processing techniques as a continuous strip, such as a thread or foil, and hence can be perceived as "foreign" to the banknote substrate, banknote or security document.

Registration of a microscale structure on one side of a substrate to a microscale structure on the other side of the substrate allows the microscale structures to be manufactured as a patch. This offers many advantages when integrating microscale structures into an existing or new security documents or banknotes, including: it is not possible to separate the microscale structures from the security document in one-piece; reduction of process steps, leading to reduced scrap and faster production; improvement in quality of the generated microscale structures; integration of the microscale structures seamlessly with other security or design features; the ability to provide multiple discrete patches of microscale structures on a single security document; the ability to choose any size or shape of the patch(es) including the microscale structures.

Registration devices are formed at each of the microscale structure formation units 12 and 14, and any additional embossing, printing or other microscale structure formation units. These registration devices are generally outside the active area on the substrate web and are read via optical sensors. The registration devices provide the necessary information to determine the side and axial position of the microscale structure formation unit and, if required, printing units. Appropriate registration marks are disclosed and discussed in WO2010042999. The optical sensors send signals back to a main registration control system indicating the relative positions of each microscale structures formation unit and any downstream printing units. However, WO2010042999 does not consider registration of microscale structures to other microscale structures (only to standard print units) or to microscale structures on opposite sides of a substrate.

Registration errors can arise between the different components at one microscale structure formation unit (e.g. between a gravure unit and an embossing unit etc.), or between the first and second microscale structure formation units (to achieve front and back registration), or between the first and second microscale structure formation units and those that apply further design elements to the web after the integrated device is already formed.

Figure 27A:
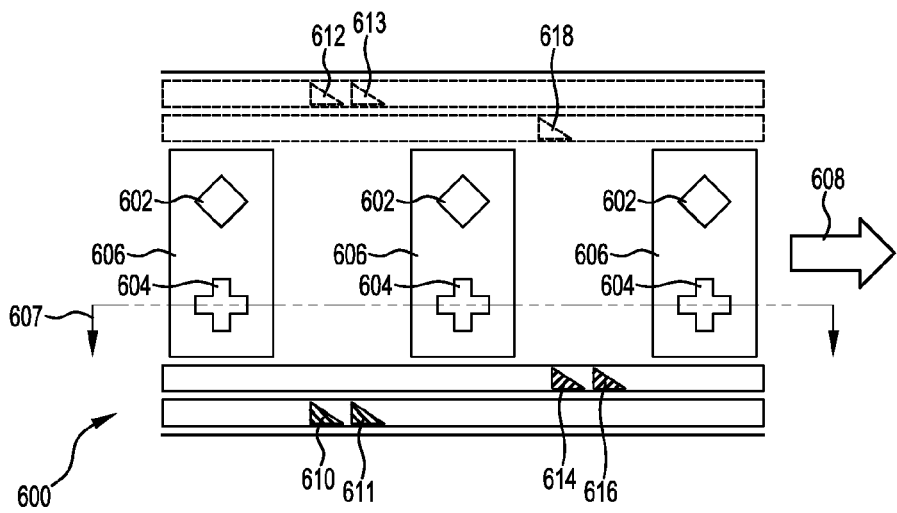
FIGS. 27A and 27B is a schematic diagram depicting a portion of a web of substrate having microscale structures formed on both sides thereon, as well as further printed imagery, and associated registration devices.
Figure 27B:
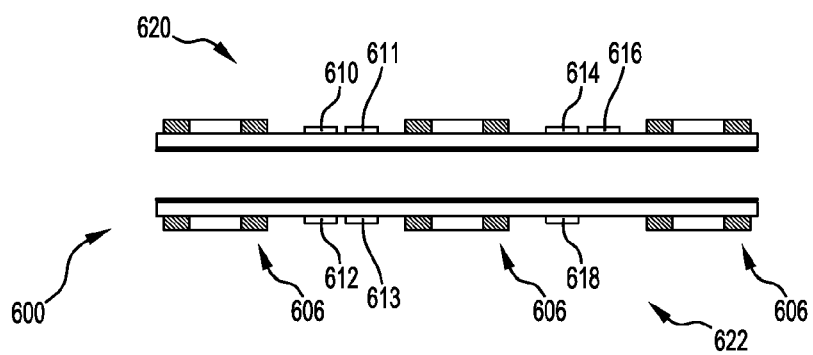

Referring now to FIGS. 27A and 27B, a schematic version of a portion of a substrate web 600 is shown, having integrated devices 602 and 604 on a security document 606. Multiple versions of the security document 606 have been applied to the substrate 600, which is part of a web moving in a direction as indicated by arrow 608 through an apparatus according to the invention as described herein. FIG. 27B is a section through the substrate 600 at section 607, shown in FIG. 27A.

Registration devices 610, 611, 612, 613, 614, 616, 618 are shown on the substrate 600. Each device 610, 611, 612, 613, 614, 616, 618 is made by a separate tool, such as a print unit or microscale structure formation unit, in an apparatus according to the invention. That is, each tool, such as a shim or print cylinder, is formed/manufactured with the relevant image structures on the tool surface, generally as recesses in the surface.

When image structures are formed on a tool, registration devices are also formed on the tool surface in a non-image area. As a result, each repeat of the tool on a substrate during printing/forming leaves a registration mark which indicates the position of all structures from that tool on the substrate. Optical devices/transducers fixed on to an apparatus according to the invention are then used to read the registration devices. As the optical devices are fixed on the apparatus, relative positioning of print/microstructures on the substrate between print units (or any other structure formation unit) can be detected. In particular, in a simple implementation, a transducer can detect the start position of a registration device and length of the registration device in the machine direction (along the length of the substrate and as indicated by arrow 608 in the exemplary embodiment of FIG. 27A).

As the registration device is a right angled triangle, or wedge, (although other registration device shapes can be used) the length of the registration device varies in the cross-machine direction (perpendicular to the machine direction). Detecting the registration device start position allows variation of position of the images laid down by the corresponding tool to be varied in the machine direction and knowing the length of the registration device at the point that optical device intersects the registration device allows the position of the images laid down by the corresponding tool to be varied, relative to images formed by other tools, in the cross-machine direction, giving an "XY" registration system.

The registration devices 610, 611, 612, 613, 614, 616 and 618 of FIGS. 27A and 27B are triangular in shape, enabling XY registration as discussed above. However, the system adds a number of variances not typically seen in print registration systems. Firstly, front to back registration, that is registration of images on opposite sides of a continuous substrate web, has not previously been considered, secondly, front to back registration of transparent formed structures/images, and, thirdly, registration of those transparent formed structures to more "standard" coloured images, such as, for example Gravure printed pigmented ink.

In the example of FIGS. 27A and 27B, registration devices 610 and 611 relate to microstructures formed in relation to integrated devices 602, 604 on a first side 620 of the substrate 600. The registration devices 610 and 611 have a pattern which acts as a light diffuser, allowing detection by an appropriate transducer, even though registration device 610 and 611 are formed in transparent ink. Similarly, registration devices 612 and 613 relates to microstructures formed in relation to integrated devices 602, 604 on a second side 622 of the substrate 600. Once again, registration devices 612 and 613 have a pattern which acts as a light diffuser, allowing detection by an appropriate transducer, even though the registration device 612 and 613 are also formed in transparent ink. It also possible to use pigmented inks for form such microstructures and, in that case, the requirement to form a particular pattern within the registration device is removed.

In the example of FIGS. 27A and 27B, registration devices 614, 616 and 618 relate to print layers which surround the integrated devices 602 and 604. Whilst the individual print layers associated with registration devices 614, 616 and 618 are not shown separately, for ease of understanding, it is to be understood that the areas surrounding integrated devices, and in some designs, overlapping such devices, comprise multiple print layers, such as different colours or security inks, in a chosen imagery design.

Registration device 618 is located on the second side 622, whilst registration devices 614 and 616 are located on the first side 620. Therefore , in this example, there are two print layers on the first side 620, associated with registration devices 614 and 616 respectively, and one print later on the second side 622, associated with registration device 618.

In the example of FIG. 1, the main drum (lens embossing roller) 40 forming part of the first microscale structure formation unit 12, and the main drum (image print roller) 64 forming part of the second microscale structure formation unit, are set as "master" units. That is, their side and angular positions will not change and other units are registered to them.

A gravure cylinder 124, forming part of the gravure print unit 20, upstream from the image print roller 64, is registered to the image print roller 64, using registration devices 612 and 613. That is, it will be adjusted, or phased, to the correct angular position via an electronic drive and to the correct transverse or side position via a linear motor drive, which moves the entire roller transversely with respect to the web. Both drives are controlled by a registration system as described above (but other registration systems may also be appropriate).

The gravure cylinder 26 forming part of the gravure print unit 18 upstream from the lens embossing roller, will register to the lens embossing roller, using registration devices 610 and 611. That is, in a similar manner to above, it will be adjusted, or phased, to the correct angular position via an electronic drive and to the correct side position via a linear motor drive, in the same manner as the gravure cylinder 124. Again, both drives are controlled by the registration system.

Both sides of the feature are now in register in their own right, that is the ink patch applied by the relevant gravure cylinder will be adjusted to be in the right position such that the relevant structures on the embossing rollers emboss into that ink patch. However, each side, the image side and the lens side are not registered to each other. Registration of lens to image now occurs via the linear compensator 56 and edge guide 58. Both are controlled via the registration system, that is detection of the position of at least one registration device on each side of the web, that is either 610 and/or 611 on the first side 620 and 612 and/or 613 on the second side 622, is used to control the linear compensator 56 and edge guide 58 such that structures formed by the lens embossing roller 40 (or any other type of microstructure formed at this formation unit) and image print roller 64 (or any other type of microstructure formed at this formation unit) are in register.

Registration error can be detected via a detector using an appropriate transducer after the second rotary microscale structure formation unit. One such transducer may be an optical device measuring relative positions of registration marks printed on the first and second rotary microscale structure formation units. This may be a simple light sensor coupled to an encoder or alternatively a CCD device with appropriate distance measuring software.

Figure 11:
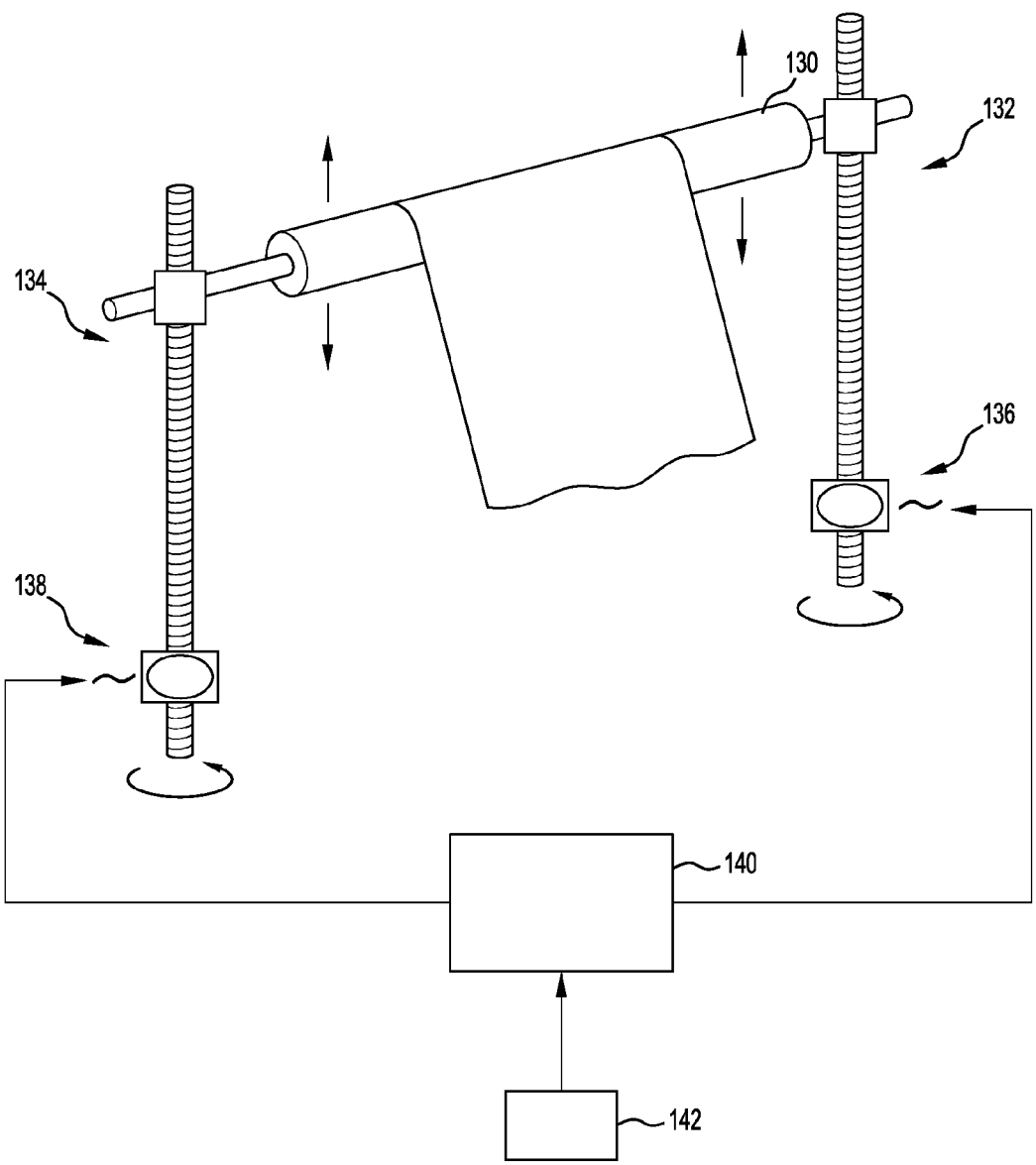
FIGS. 11 and 12 are schematic diagrams of two different parts of a registration control system forming part of the apparatus shown in FIG. 1.

As shown in FIG. 11, the linear compensator 56 is used to control registration in the machine direction, being the direction in which the substrate web is pulled through the machine, and consists of an idler roller (a non-driving roller) 130 connected on each side to screw control mechanisms 132, 134 respectively driven via servo motors 136, 138.

Registration is achieved by moving the roller traverse to the machine direction (e.g. either up or down) and to the plane of the web, thereby either increasing or decreasing the substrate web length between the first and second microscale structure formation units 12, 14. The idler roller is driven up or down on the screw via the servo motors 136, 138. Both motors are controlled via a main registration system 140. As would be readily appreciated, the idler roller could be moved by other means, such as a piston, linear motor, etc., as required.

A transducer 142 is positioned after the second rotary microscale structure formation unit 14 to detect registration error and provide an input signal to the registration system 140.

Figure 12:
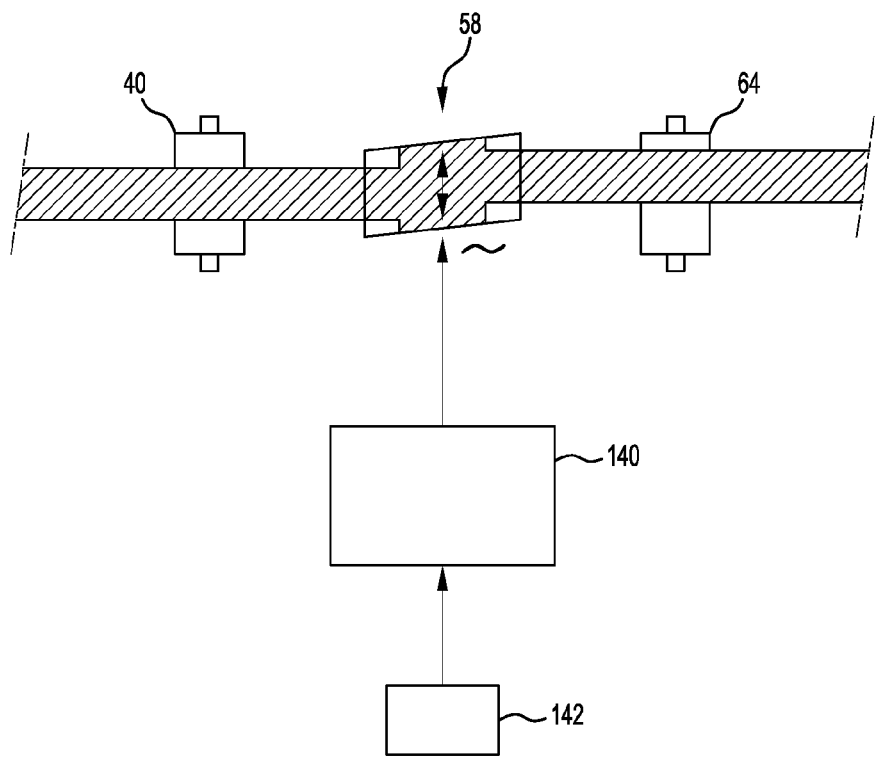

As shown in FIG. 12, the edge guide 58 is used to control registration traverse to the machine direction and to the plane of the web (e.g. sideways registration), or the position of the substrate web along the axial direction of the relevant microscale structure formation unit. The edge guide 58 receives a signal from the main registration system 140 and will move the web sideways to ensure both microscale structure formation units 12 and 14 are registered to each other in the side direction.

It should be noted that the choice of a linear compensator and edge guide in combination with "standard" registration systems between each microscale structure formation unit and other printing units, allows for improved quality of formed structures and greater life of the impression or printing structure (such as the structures on shims) of the microscale structure formation unit. This is because, if the rollers of the microscale structure formation units had electronic rotational drives and axial linear drives, then the impression or printing structure would be moved both rotationally and axially against the substrate web, causing greater wear on the structures and, due to the very small sizes being created, poorer quality structures (micron, or smaller, sized structures may be smeared or destroyed due to the relative movement).

Once the embossing and/or printing rollers are registered and the linear compensator 56 and edge guide 58 are registered, subsequent print units can be registered back to either one of the microscale structure formation units. This is typically achieved in a similar manner to the gravure stations in the embossing units, i.e. each gravure cylinder will be phased to the correct angular position via an electronic drive and to the correct side position via motor control. Both drives are controlled by the registration system 140.

If the structures created by the first and second microscale structure formation units are sufficiently tolerant to the movement of the impression or printing structures against the web substrate and/or wear of the impression or printing structures is not of issue (many factors may contribute to this, such as small runs, improved materials for impression/printing structures etc.), then it is possible to have the first and second microscale structure formation units controlled by "standard" in-line print registration means, namely rotational drive in the machine direction and linear drive in the axial direction.

A final component of the XY registration system is the registration of the flexographic units 66 and 68 to the drum 64. In the preferred embodiment, both flexographic unit 66 and 68 are mechanically or electronically (through extremely accurate encoders) geared to the central drum 64. Again, preferably, the flexographic units 66, 68 have cylinders in contact with the drum 64 which turn twice relative to a single turn of drum 64. The flexographic units 66, 68 are, therefore, manually registered to the drum 64, preferably by an inspection system and appropriate measurement of the registration error.

Skew Registration

Being a web-fed process, differences in gauge can result in cross direction variation of the tension of the web. Whilst variances are self-correcting, due to the fact that they are the same at both or all rotary microscale structure formation units, a slack centre or a slack edge in the web can result in web tension variants which can manifest itself by variation in magnification, orientation or both.

Devices including microscale structures, such as micro optical devices, as described herein are not, by nature, tolerant to skew. Minor variation in skew due to process issues such as shim skew, shim mounting skew, web material thickness and other process variations can render the micro optical feature distorted or unrecognisable.

The control and management of skew is important to the aesthetics of some devices, notably those devices forming or including micro optical security features. In some cases, skew in the region of 0.02 degrees may render the feature undistinguishable, and hence, the ability to influence, or change, skew during the process can be advantageous.

Skew, in the context of this specification, is the angle of the substrate web relative to the angle of the impression structures on the first or second microscale structure formation units.

In the apparatus shown in FIG. 1, the first and second rotary microscale structure formation units 12 and 14, and/or any additional microscale structure formation units upstream or downstream therefrom, each include a main drum over which the web passes. The registration compensation system includes a skew roller prior to at least one of the main drums, and a skew compensator to compensate for web skew by controlling relative pivoting between the skew roller relative and the main drum to alter web entry angle at the at least one main drum.

As shown in FIG. 1, skew rollers 32, 62 are respectively located next to the first and second microscale structure formation units 12, 14. In the example shown in FIGS. 13 to 15, the skew roller 32 is shown in different positions which change the angle of the substrate web relative to the microscale structure formation unit 12. The angular position of the skew roller 32 is determined by a skew compensator including a fine thread screw 144 coupled to the skew roller 32 on one side of the web 16 and controlled by a servo motor 146, and a fine thread screw 148 coupled to the skew roller 32 on the other side of the web 16 and controlled by a servo motor 150, or alternatively by electrical, pneumatic, or mechanical means. The skew roller 62 is controlled in a similar manner.

Figure 13:
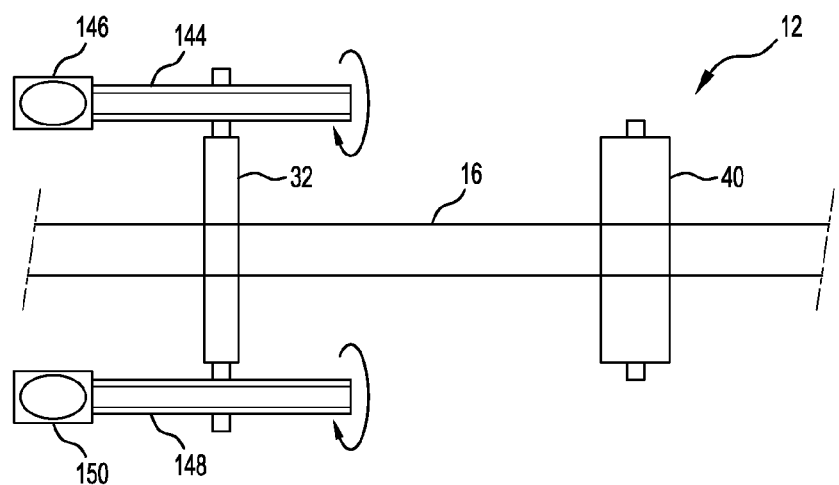
FIGS. 13 to 16 are schematic diagrams depicting elements of a skew compensation system forming part of the apparatus shown in FIG. 1 in various operative states.
Figure 14:
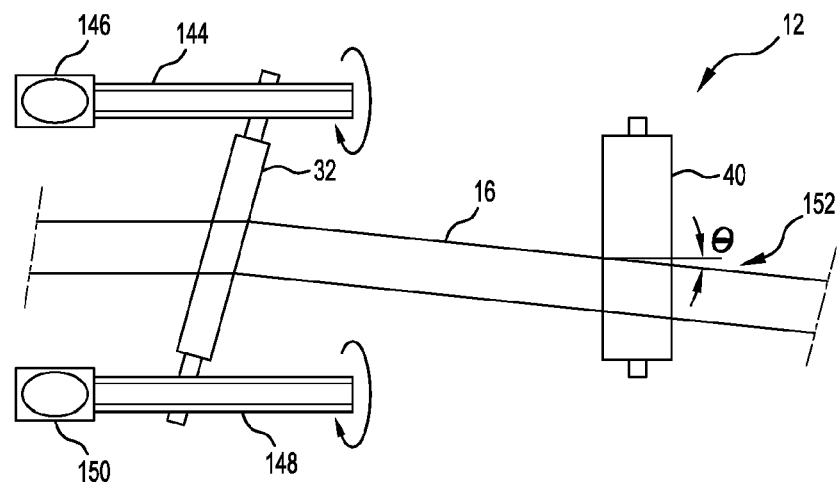
Figure 15:
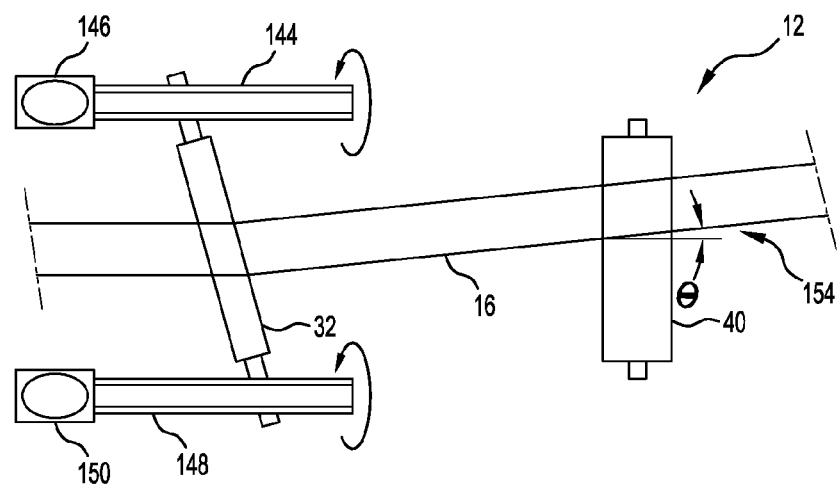

Although only three positions of the skew roller 32 are shown in FIGS. 13 to 15, any number of positions are available according to the control resolution of the skew roller.

Zero Position

In this position, shown in FIG. 13, both servo motors 146 and 150 are in their zero or datum position and there is no influence on the substrate web 16.

Position 1

In this position, shown in FIG. 14, the servo motor 146 on one side of the substrate (in this case at the top of the image) is driven to its maximum positive position, and the servo motor 150 on the other side of the substrate (in this case at the bottom of the image) is driven to its maximum negative position. This causes the web to skew to an angle (theta-1) 152 relative to the microscale structure formation unit.

Position 2

In this position, shown in FIG. 15, the servo motor 146 on one side of the substrate (in this case at the top of the image) is driven to its maximum negative position, and the servo motor 150 on the other side of the substrate (in this case at the bottom of the image) is driven to its maximum positive position. This causes the web to skew to an angle (theta-2) 154 relative to the central drum.

Figure 16:
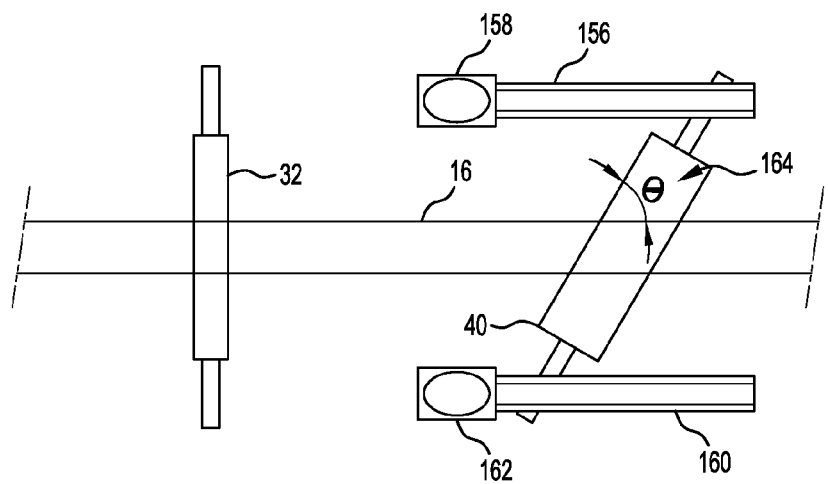

It is also possible to control skew by moving the microscale structure formation units, as shown in FIG. 16, in a similar manner to as discussed above with the skew roller. In this case, the angular position of the central drum 40 of the microscale structure formation unit 14 is determined by fine thread screw 156 coupled to the drum shaft on one side of the web 16 and controlled by a servo motor 158, and by fine thread screw 160 coupled to the drum shaft on the other side of the web 16 and controlled by a servo motor 162, or alternatively by electrical, pneumatic, or mechanical means.

The impact is the same as previously, i.e. the web runs at an angle (theta) 164 relative to the central drum. The microscale structure formation units are relatively complicated units and house other important systems, such as curing systems and application systems. As such, whilst it is possible to operate in this mode, it is advantageous to use a skew roller as described above.

Figure 17:
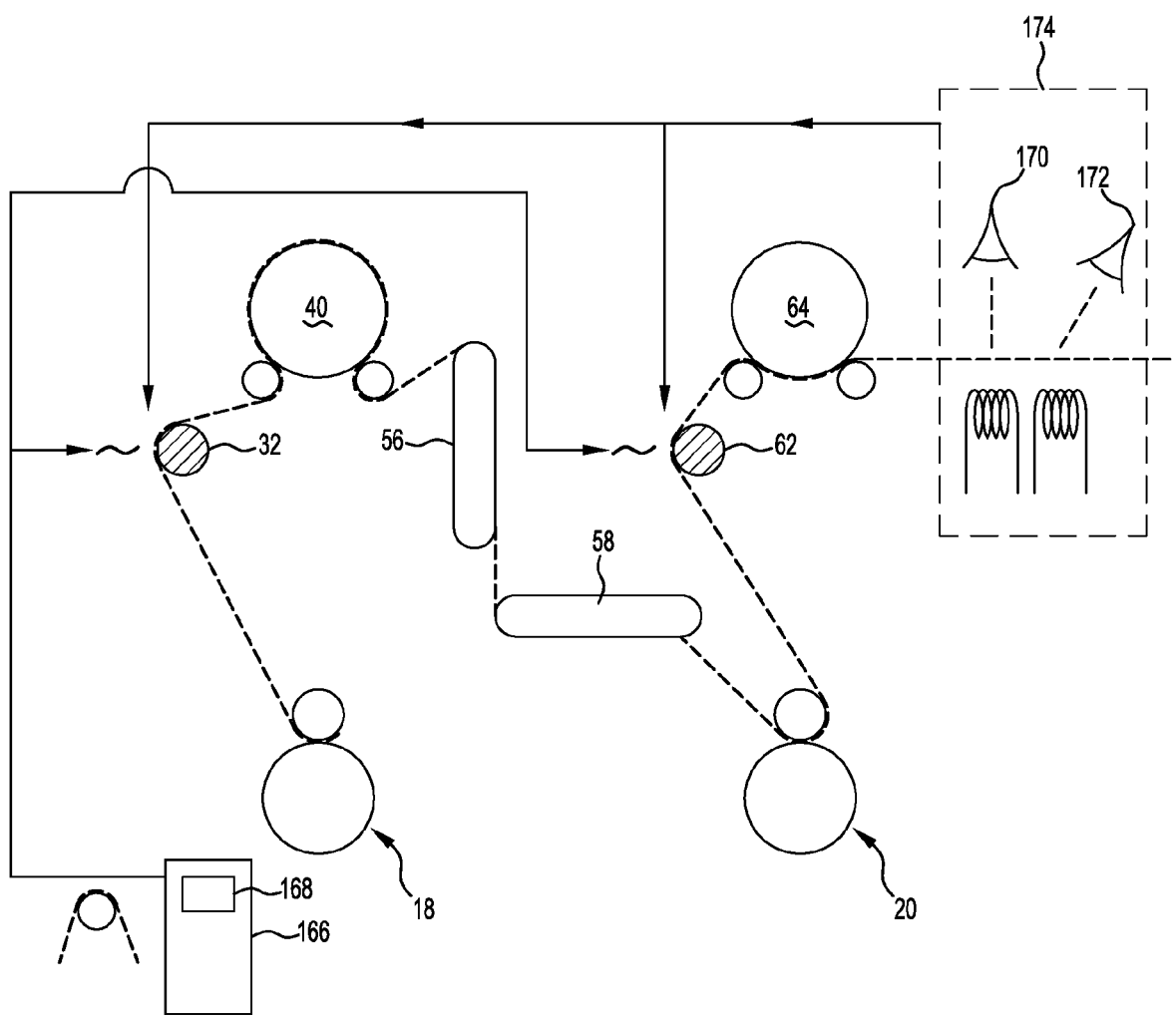
FIG. 17 is a schematic diagram depicting further elements of the skew compensation system forming part of the apparatus shown in FIG. 1.

The control of skew can be performed manually or automatically, as shown in FIG. 17. In the case of the manual operation, the operator can manually adjust the skew rollers by driving the various servo motors from a suitable control system 166 from a console 168.

Skew registration marks can be formed on the substrate web, for use by manual operation, or, more advantageously, inspected by optical sensors 170 and 172 so that skew may be automatically controlled.

An inspection system 174 can then measure and quantify this skew, and provide feedback to the skew rollers 32 and 62 to adjust for this skew, thereby correcting the skew. This is a feedback loop whereby skew is monitored, quantified and controlled automatically through the inspection system 174 sending signals to the servo motors 146 and 150 on the skew rollers 32 and 62.

One example of suitable skew registration marks involve a pattern that will magnify the skew in the process by moiré magnification. In this case, microlenses are formed by a first microscale structure formation unit and an image layer formed by a second microscale structure formation unit in an area of the web away from areas which will form part of the final product, such as the gutter (the very edge of the web).

Moire magnification is a relatively well known phenomenon for viewing aesthetics and security features but it can also be used as a skew detector. For example, on one surface of the web, a periodic structure can be formed. On the opposite side, focussing elements can also be formed. Focussing elements can simply be a set of lines or other diffractive structure. For example, the line frequency can be similar to that of the lenses, such that moiré magnification occurs.

As the angle between the periodic structure and the lenses increases due to skew, there is a corresponding change in moiré magnified image of the periodic structure. When this occurs and the skew is small, the resulting moiré magnification effect is relatively large. This will create a large pseudo magnification of the periodic structure which can then be measured by a suitable measurement device.

As the skew increases, the frequency disparity increases, thereby resulting in produced decrease in the pseudo magnification. An appropriately designed measuring device can be programmed to recognise the pattern.

The use of skew patterns, for example in a dead area of the sheet, such as the gutter, to be produced from the web, combined with the associated inspection system, automatic skew rollers and marking systems, allows for a process capable of achieving a high quality feature and a higher level of process control and insurance.

Negative or Reverse Image Shim Design

In order to avoid frequent production stops due to shim wear, which can occur either in the production of image elements, lenses or Fresnel or diffractive structures, the shim can include one or more ink-housing recesses defining a non-image area and one or more non-recessed areas defining an image observable to a user, the ink-housing recesses having a larger extent than the non-recessed areas in order to produce a reverse-image or negative-image when the ink is printed. In this way, line structures that produce an image observable to a viewer are areas that contain little or no ink, and the remainder of the shim is covered with a continuous or semi-continuous layer of ink. The result is that there is little or no requirement for wiping of the shim, which is generally required for suitable contrast is positively printed images of this type, and the shim therefore no longer undergoes wear caused by known high resolution moiré magnifying and integral image systems due to wiping. As a result, the non-recessed area of the shim will also receive ink, but this thickness over the non-recessed areas will be very thin, much less than that of the recessed areas. The amount of ink retained in the non-recessed areas must be small enough such that the human eye can readily appreciate a difference in contrast. The actual thickness that achieves this functional requirement will depend on the transparency and colour of the ink, but, preferably, is less than 0.5 µm and, more preferably less than 0.25 µm and most preferably less than 0.1 µm.

In other words, the shim includes an image area and a non-image area, wherein one or more ink-housing recesses are formed in the non-image area and ink-housing recesses are omitted from the image area, the shim thereby acting to print a negative or reverse image. This can be seen, as an example, in FIGS. 8 to 10, where ink 88 represents a background to an image to be printed, and therefore takes up a greater area than the non-recessed portions of the shim 84, which, consequently hold little or no ink.

Transparent UV Curable Ink in Shim

Alternatively, increased shim lifetime, and fewer halts to a production run, can also be achieved by replacing image pigmented UV curable ink with a transparent UV curable ink. In this form, once again there is no need to wipe the shim. At a later stage in the printing process, one or more of the printing inks can be used to apply additional pigmented layers to the surface of the transparent image layer. For example, the image structure 88, patch 92 and patch 96 shown in FIG. 10 can be formed from clear UV curable ink. A subsequent print process can then apply a "standard" web press ink or inks, such as a gravure ink, over the structure 88. The web press ink(s) may be visible in the visible spectrum or be excited using a radiation source such that they are viewable outside of the visible spectrum. By addition of these additional layers, a number of differing and distinct effects can be achieved. For example, if a fluorescent ink is used in the image layer with or without an additional visible pigment, and not in the covering ink layer, the image will change colour under fluorescent lighting. If however, a UV absorbing layer is printed on the front or back of the document, the image layer can be made to selectively illuminate in the shape of another hidden image. In addition, different colours can be applied over different areas of the structure 88 to create a device which has multiple colours without requiring to apply different colours UV curable inks.

By printing a 100% coverage layer of a transparent UV curable ink layer on the transparent image layer, it is possible to add designs to the subsequent coloured layers on top of this and to use this to create additional design elements. Reference is made to co-pending Australian provisional application 2017902534 in this regard, which is hereby incorporated by reference.

Mechanical Description of Shim Mounting

Mounting of the shims used to form the microscale structures is important for management and control of skew. Traditional mounting techniques are manual and, as such, do not have the capability to achieve the tight skew tolerances for micro optical features or other microscale structures. It is not possible for the operator to make such small adjustments to the angular position of the shims prior to mounting, furthermore in most cases, the optical system for viewing the alignment marks on the shim do not have sufficient resolution to allow the operator to correctly align the shim.

In this case, an automated machine, with high resolution cameras and encoders, is employed to remove the operator intervention during shim mounting. This machine will automatically mount the shims on to the drums, also known as cylinders, to the desired tolerances, and provide the capability to perform a QC check on the shim position prior to releasing the shim for production.

Figure 25:
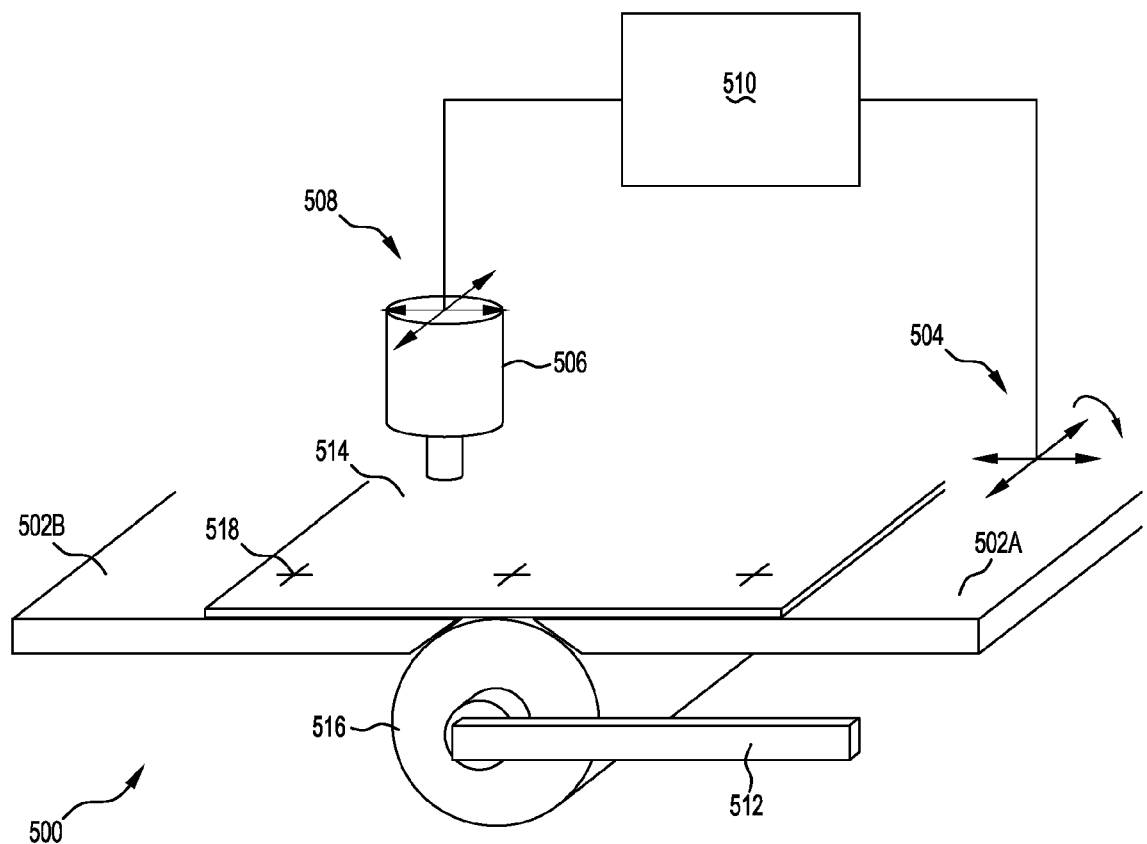
FIG. 25 is a schematic diagram depicting shim mounting equipment for use in assembling one or more embodiments of the apparatus shown in FIG. 1.

Referring now to FIG. 25, a mounting apparatus 500 is shown having a shim table 502A, 502B having a table movement means 504, camera system 506 having a camera movement means 508, a control system 510 and a cylinder holding means 512. The camera movement means 508 and table movement means 504 are, preferably, by linear and rotational drive systems controlled the position of which is measured by appropriate resolution encoders.

The camera system 506, by virtue of the camera movement means 508, can move in, at least, a two dimensional plane (X and Y directions).

A shim 514 and cylinder 516 are also shown in position on the shim table 502A, 502B. The shim 514 includes positioning marks 518. The control system 510 has, in its memory, an appropriate description of the shim 514, the positioning marks 518 and cylinder 516.

After initial placement of the cylinder 516 in the cylinder holding means 512, which are preferably cylinder clamps, the shim 514 is placed on the table 502A, 502B and the camera system 506 is used to assist an operator in the placement of the shim over the cylinder 516, such that the shim 514 is in, generally, the right position, using the positioning marks 518.

The control system 510 then collects data automatically, by moving the camera system 506 and attempting to quantify the position of the positioning marks 518. With this data collected, the control system 510 compares the position of the shim 514 to the theoretical position (Zero skew), orients the shim 514 via the table movement means 504 relative to the cylinder 516, to the theoretical zero skew position.

The control system 510 then performs a QC function and verifies the level of skew. If the operator is satisfied with this, mounting of the shim 514 onto the cylinder 516 will take place.

Figure 26:
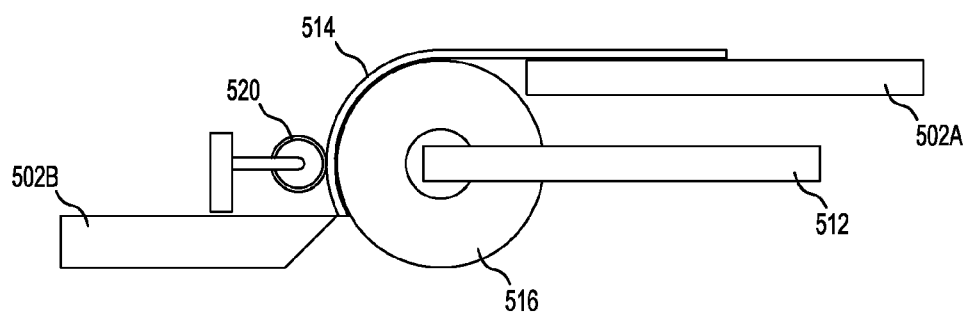
FIG. 26 is a schematic diagram depicting shim mounting equipment, as described in relation to FIG. 25, during the mounting process.

Referring now to FIG. 26, the shim table has two parts; a back table 502A, which will support the back half of the shim and a front table 502B, which will support the front half of the shim. The mounting apparatus now provides a pressure roll 520 and moves the front table 502B, whilst applying pressure to the shim 514 via pressure roll 520 such that the shim is 514 is manipulated around the cylinder 516. Preferably, the back table 502A secures the remainder of the shim 514 via a vacuum. Suitable fixing means, prior to mounting into the mounting apparatus 500, is provided on the cylinder 516 to hold the shim 514.

The pressure roll 520 is then moved to the top dead center of the cylinder 516 to apply the shim 514 by rotating the cylinder 516.

The mounting system 500 has been designed and built such that the maximum skew across the cylinder width is 0.00625 deg.

Temperature Control of Central Drums

In order to ensure adequate and correct transfer of the UV curable ink from the shim, it may be necessary to control the temperature of the shim. That is, the viscosity of the ink when applied to the impression structures is an important aspect of achieving well-formed structures in the micron and smaller scale. In some cases, the required temperature may be as low as 7 degrees Celsius.

However, an additional aspect of temperature control is maintaining the temperature of the drums above the dew point in the environment in which they are operating. Failure to do so causes water to form on the drums, due to the water vapour condensing on their cooler surface. This can introduce water droplets into the microstructures and cause defects in the final microstructures.

Figure 18:
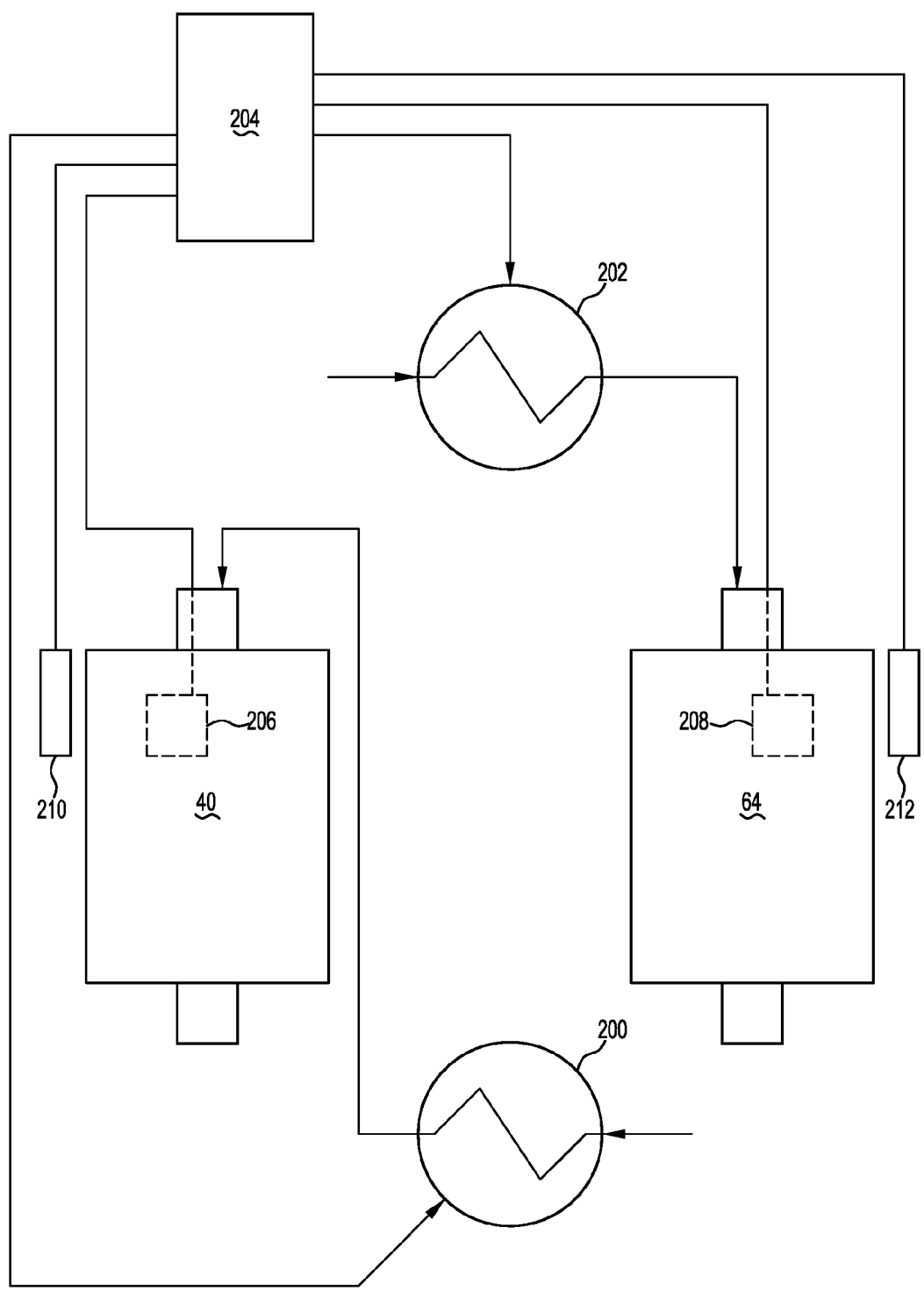
FIG. 18 is a schematic diagram depicting elements of a drum temperature control system forming part of the apparatus shown in FIG. 1.

Temperature control of the shim can be achieved by connecting the central drums 40 and 64 of each microscale structure formation unit respectively to heat exchangers 200 and 202, as shown in FIG. 18, which are preferably chilled water systems. The operator can set the desired temperature via a control system 204 and this is monitored via inline thermocouples 206 and 208, or external thermocouples 210 and 212 that measure the surface of the central drums through non-contact temperature measuring devices.

It is also possible to maintain the temperature of the drums above the dew point by controlling environmental factors, such as through an environmental control system, such as by operating de-humidifiers, to reduce the relative humidity, or by lowering the air temperature, thereby reducing the dew point for a particular relative humidity.

Temperature Controlled Ink Supply System

Figure 19:
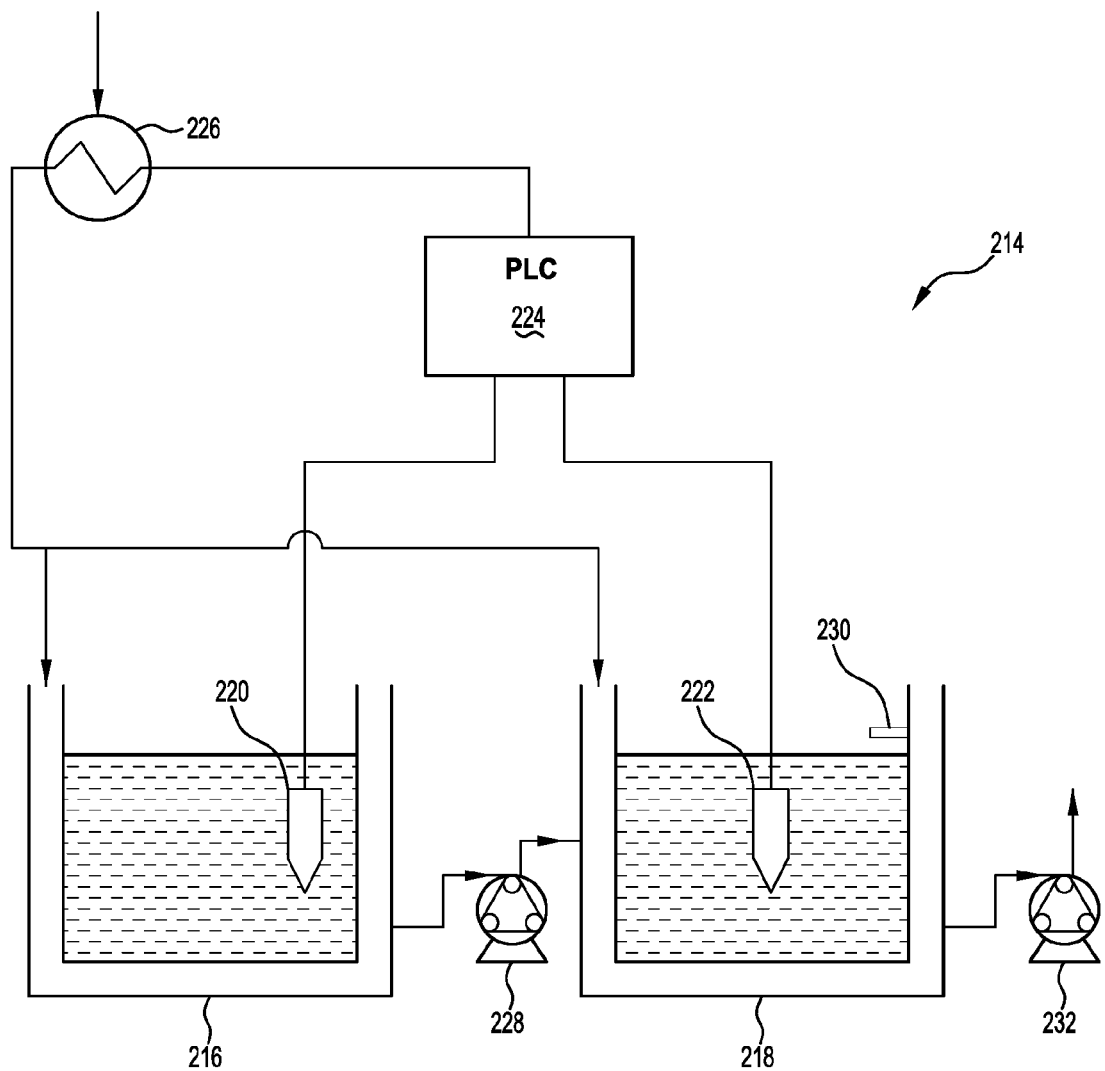
FIG. 19 is a schematic diagram depicting elements of an ink viscosity control system forming part of the apparatus shown in FIG. 1.

In addition to the temperature control of the central drums, ink viscosity can be controlled by varying the temperature of the ink. To ensure adequate ink transfer, and print quality, it is necessary to closely control the ink temperature to yield a viscosity in the range of 0.02 to 0.175 Pa·s, preferably 0.070 Pa·s to 0.080 Pa·s. To achieve this, microscale structure formation units 12, 14 include an ink viscosity control means. In an exemplary embodiment, the ink viscosity control means is ink viscosity control system 214, as shown in FIG. 19.

The ink viscosity control system 214 includes two ink tanks 216 and 218. Both ink tanks are double skinned vessels and are temperature controlled via water supplied between the skins of each vessel. Water temperature is controlled via thermocouples 220 and 222 immersed in the ink vessels. Each thermocouple measures the temperature of the ink in the respective vessel and provides feedback to a PLC control system 224.

The PLC control system 224 sends signals to a heat exchanger 226. The heat exchanger 226 will send water to the double skinned vessel of each of the two ink tanks 216 and 218 at a set temperature. In the exemplary embodiment depicted in FIG. 20, there are two ink tanks, however in other embodiments a single ink tank only may be used.

The first ink tank 216—called a "preheat tank"—maintains ink at the required temperature. Once ink is consumed from the second ink tank 218, a peristaltic pump 228, will engage as the ink level falls below a level sensor 230, and this will ensure the ink in the ink vessel is maintained at a constant level and temperature.

The second ink tank 218 is also temperature controlled in the same manner as the pre heat tank. Ink is supplied from this tank to the apparatus 10 via a peristaltic pump 232. Peristaltic pumps are employed to minimise foaming and bubbles, phenomena common with UV curable inks.

Ink is manually added to the pre heat tank, although this can also be supplied automatically from a master tank.

Alternative Apparatus Configurations

As has been previously mentioned in this document, in the context of this disclosure, the words "first" and "second" are neither intended to covey the sense in which the web is fed nor the sequence in which any of the microscale structures is formed. The words "first" and "second" are intended to distinguish like named elements from each other.

Figure 20:
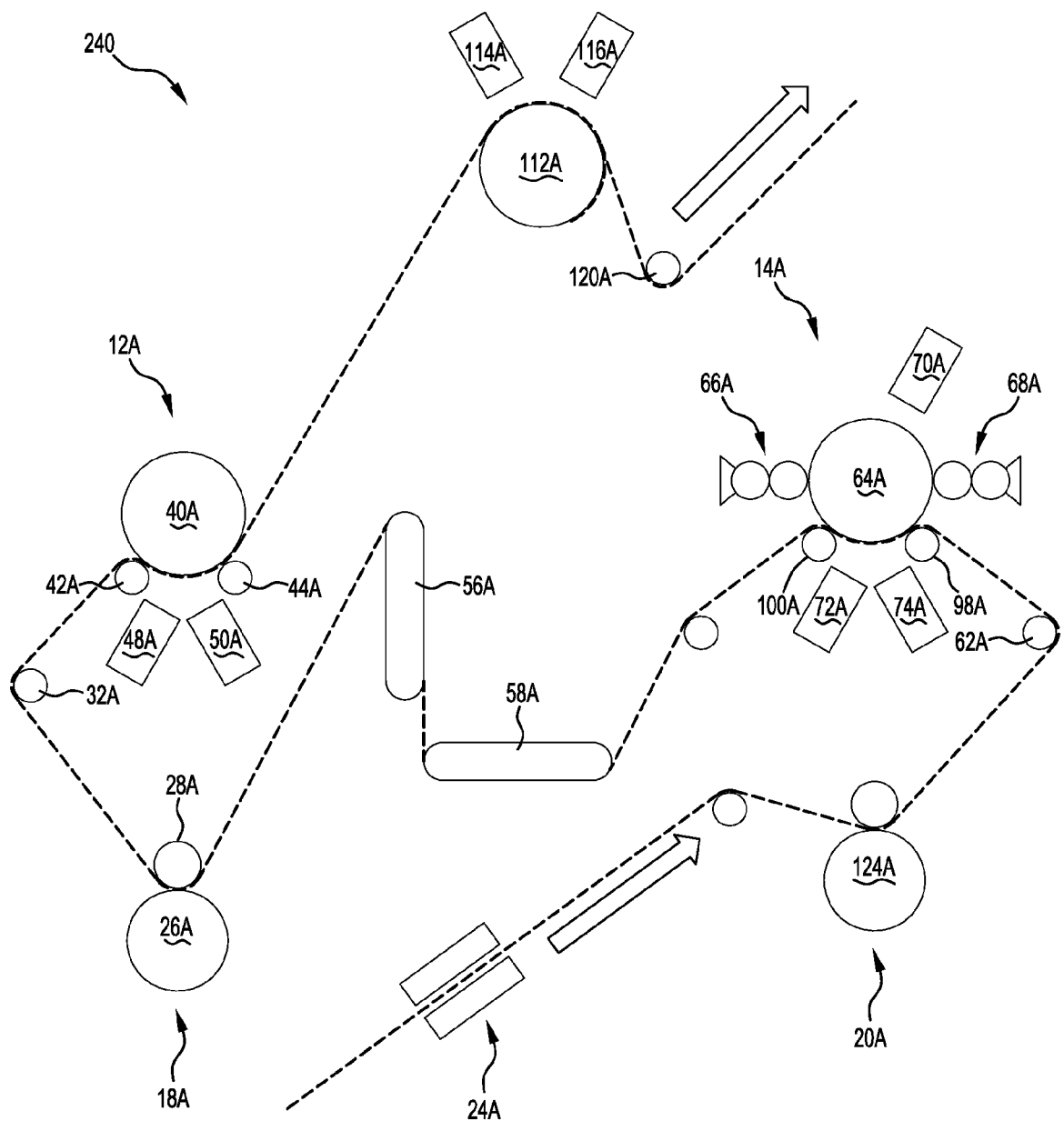
FIGS. 20 to 22 are schematic diagrams of three alternative embodiments to the embodiment depicted in FIG. 1 of apparatus for in-line manufacturing of a two-sided product, such as a banknote.

To that end, FIG. 20 depicts an apparatus 240 for manufacturing a two-sided product with an integrated micro-optic device on a web of material that includes identical or similar elements to the apparatus 10 depicted in FIG. 1—reference numerals of identical or similar elements include the same reference numeral as shown in FIG. 1 with the addition of the letter A afterwards. However the direction in which the web of material is fed through the apparatus in FIG. 10 is reversed to that shown in FIG. 1, so that the web is initially fed through the "second" rotary press 14A and subsequently fed through the "first" rotary press 12A.

Furthermore, and as mentioned herewithin (i) the specific details of each rotary microscale structure formation unit, such as the number of printing stations, rollers, UV curing lamps and other devices, may vary according to the properties of one or both of the microscale structures applied to opposing sides of the web, and (ii) the rotary microscale structure formation units can each be adapted to form microscale structures acting as focussing elements and/or image elements.

Figure 21:
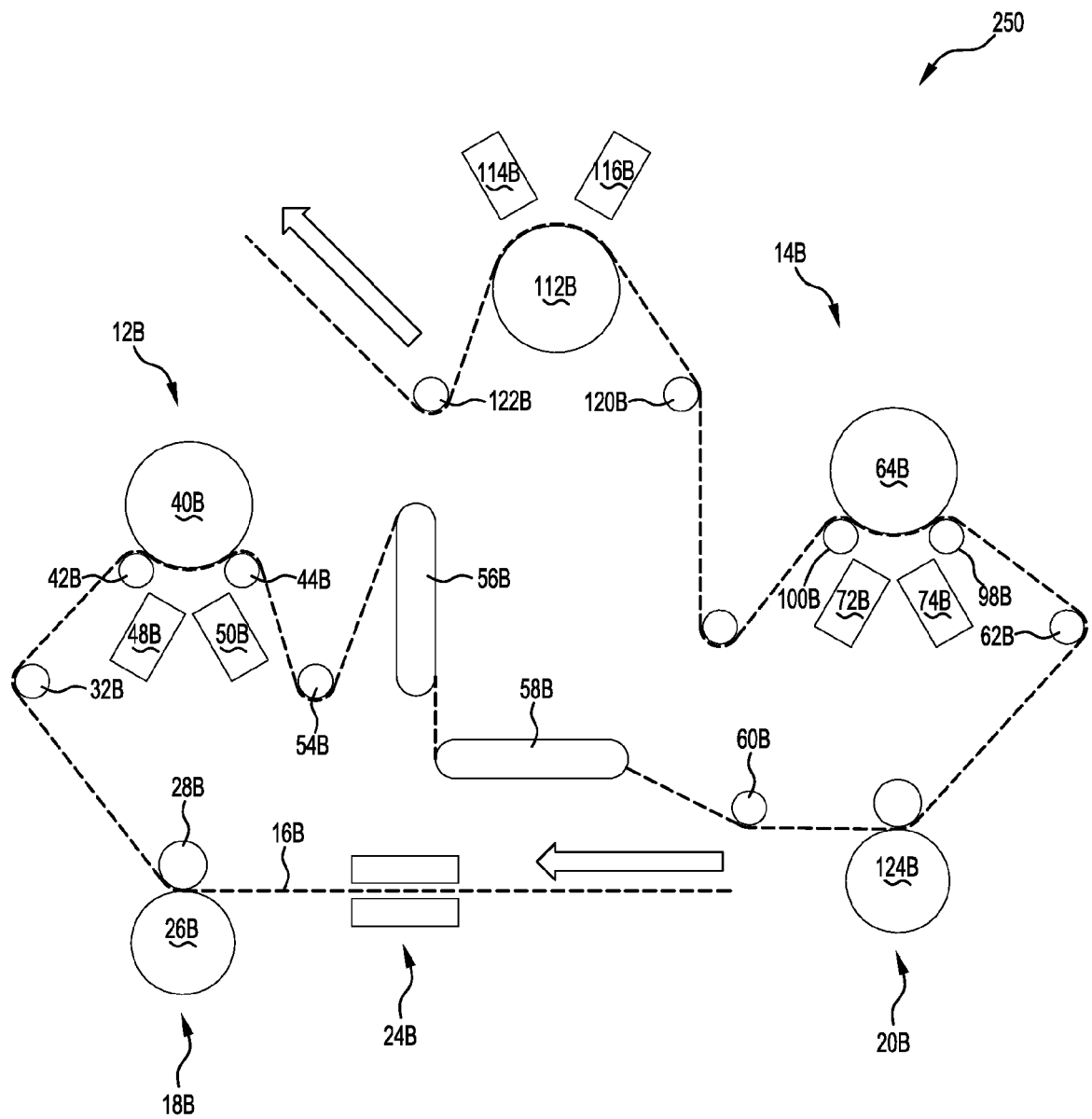

By way of example, FIG. 21 depicts an apparatus 250 for manufacturing a two-sided product with an integrated micro-optic device on a web of material that includes identical or similar elements to the apparatus 10 depicted in FIG. 1, but without any flexographic printing units or a precuring lamp. Microscale structures on both sides of the web are formed by embossing. In this Figure, reference numerals of identical or similar elements include the same reference numeral as shown in FIG. 1 with the addition of the letter B afterwards.

Figure 22:
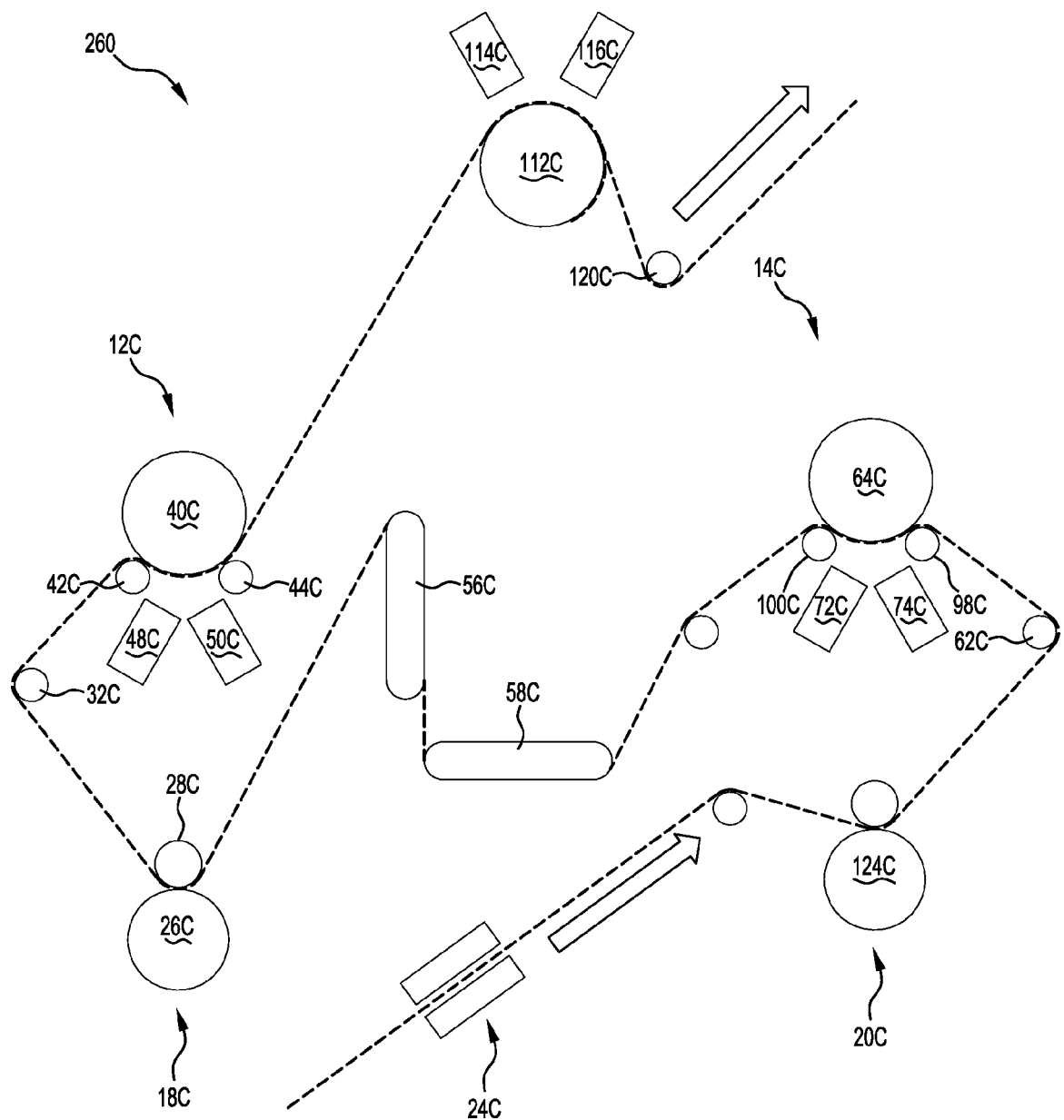

Finally, and again by way of example only, FIG. 22 depicts an apparatus 260 for manufacturing a two-sided product with an integrated micro-optic device on a web of material that includes identical elements to the apparatus 250 depicted in FIG. 21. In this Figure, reference numerals of identical or similar elements include the same reference numeral as shown in FIG. 1 with the addition of the letter C afterwards. However the direction in which the web of material is fed through the apparatus in FIG. 22 is reversed to that shown in FIG. 21.

In-Line with Printing Presses

Importantly, the apparatus 10 is preferably integrated into an in-line printing press, such as a gravure press or other printing press, thereby allowing for the integration of other design and security features into the web 16.

Figure 23:
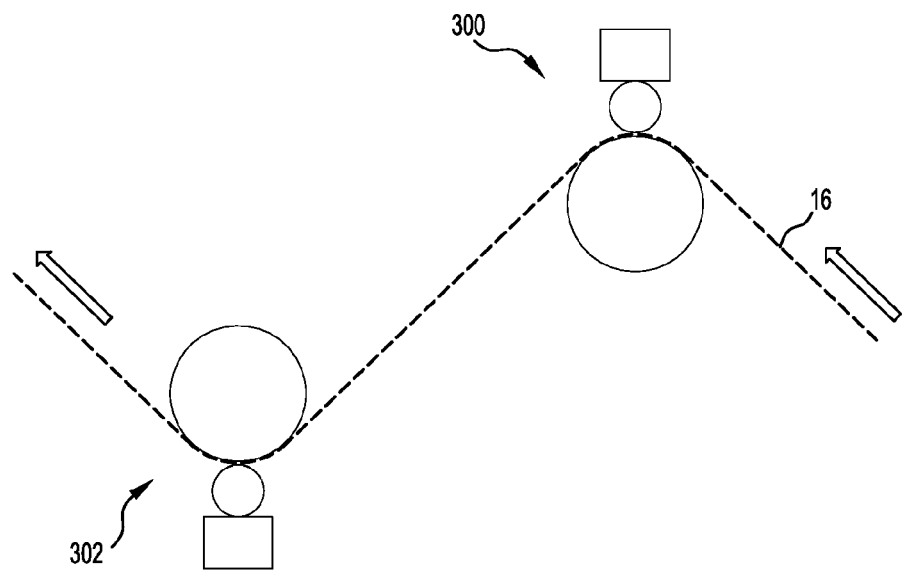
FIG. 23 is a schematic diagram depicting additional printing units positioned in-line with the apparatus shown in FIG. 1, for forming additional design features to the two-sided product.

As shown in FIG. 23, in one embodiment the web 16 exits the apparatus 10 and continues through gravure print units 300 and 302. Further gravure print units (not shown) can be utilised to print further print layers in any suitable design on either side of the web 16. Whilst FIG. 23 has been described in relation to FIG. 1, in that web 16 in FIG. 23 is a continuance of the web 16 in FIG. 1, the apparatus of FIG. 23 is applicable to any arrangement of the microstructure formation units as described herein.

In this manner, the web 16 can be printed, in a known fashion using standard print processes, in the same in-line process as the creation of micro-structures. This is particularly advantageous because: it is faster and more efficient to perform these two operations in-line, reducing cost in both the reduction of time associated with creating such a product and the reduction of scrap; greater process control between the creation of microstructures and "standard" print processes, enabling more detailed integration between the two different processes (not limited to threads or stripes) and reducing the registration tolerances between each process, as the registration system can be controlled more accurately when part of the same system. In particular, registration accuracy between print units can be increased, compared with, particularly, sheet-fed print systems. The registration accuracy achieved between any standard in-line print unit and a microstructure formation unit is less than 300 microns and, preferably, less than 100 microns.

Figure 24:
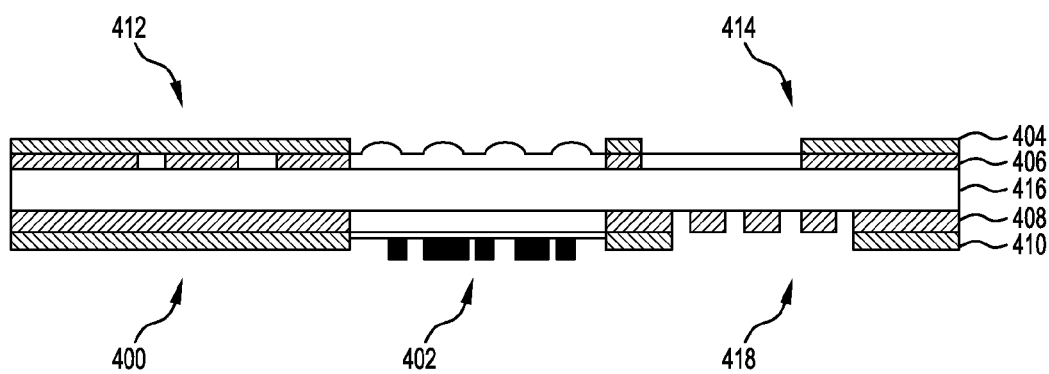
FIG. 24 is a schematic diagram depicting an exemplary two-sided product including the integrated device shown in FIG. 11 and additional design features forming by the additional printing units shown in FIG. 23.

Now referring to FIG. 24, a two-sided structure 400, as described in relation to FIG. 11, forms part of a security document 402, of which a central substrate 416 is, or was previously before being separate, a portion of a web, such as the web 16 described above. In this embodiment, the web is a transparent polymer substrate, such as Biaxial Polypropylene (BOPP). The security document 402 includes two opacifying layers, in the form of printed ink layers produced by the process described in relation to FIG. 24, on each side 404, 406, 408, 410. The security document 402 includes a security feature, known as a shadow image 412, which is, generally, visible in transmission but not reflection, as printed ink layer 406 includes unprinted portions in the area of the shadow image 412 which form an image in transmission, due to the change in opacity, but is generally not visible in reflection. Also included in the security document 402 is a window region 414 which includes unprinted regions in all printed ink layers 404, 406, 408, 410. A vignette 418 is also present in the window 414 created by a design printed in the window 414 in the printed ink layer 408.

The security document 402, in this form, is classified as a security substrate, ready for further processing steps, such as further printing by traditional security printing means, such as intaglio, offset and letterpress, or finishing processes, such as guillotining and packaging.

Types of Integrated Devices

Various embodiments of the invention provide an in-line process for the manufacture and integration of microscale structures on two sides of a web substrate, and particularly lens based features coupled with high fidelity printed images, using one or more in-line, web-fed printing presses.

In one or more embodiments, a UV embossing and curing process can be used for the manufacture of micro-lenses, and a UV printing process used to create the image layer formed on an opposing side of substrate to which the lenses are formed. The two layers can be produced in the form of discrete surface areas, as described in the above embodiments, which are then registered to each other.

Alternatively, the image and lens layers can be produced as a continuous area in the form of a strip that extends over a part or all of the web on one or both sides. Registration for embodiments in which one or both of the image and lens layers are produced in the form of a strip may be required in one direction only, for example, where the lenses are lenticular lenses, whereas registration for image and lens layers produced in the form of discrete areas may require registration in both the machine and cross direction of the apparatus 10.

As mentioned above, any embodiments when one or both of the microscale structures formed on opposing sides of the web are light focussing elements, such elements may be conventional refractive or reflective structures but may also be Fresnel lenses, binary diffractive zone plates or multiple level diffractive zone plates. For high speed processing, and also for downstream additional processing, Fresnel or diffractive structures may be preferable due to their simpler manufacturing process and greater tolerance to misalignment.

Furthermore, the microscale structures produced on either side of the web substrate may be diffractive, refractive or reflective. For example:
  a. a combination of focussing elements (of any suitable type) on one side of the document and diffractive image elements on the other side in register;
  b. diffraction gratings on either side of the document which each produce pre-defined diffractive effects, such as pseudo holograms, such that a degree of optical variability is provided
  c. Diffractive Optical Elements (DOEs), such as those disclosed in WO2008031170, which is hereby incorporated by reference. DOEs are computer generated "holograms" in that a diffractive structure is created which causes a point light source to create an image structure. DOEs, typically, have a specific wavelength of light at which they are best viewed, but can be viewed with any point light source with some suboptimal effects, such as rainbow fringes on the images when a white point light source;
  d. Micro-reflective structures, or micromirrors, which are wholly or partially reflective, on both sides of the web to provide various micro-reflection effects;
  e. Focussing elements on both sides of the web substrate to provide a double sided optically variable effect, such as those described in WO2017072566, which is hereby incorporated by reference; or
  f. Other combination of microscale structures which are suitable for manufacture in radiation curable ink on a web substrate.

A wide variety of a two-sided products with an integrated device may be manufactured by the apparatus 10, 240, 250 and 260, including a variety of combinations of first and microscale structures.

First Microscale Structure Forms an Array of Light Focusing Elements

For example, the first microscale structure may form an array of light focusing elements, such as micro lenses. The focusing elements may be embossed at the first rotary microscale structure formation unit.

One or more patches of ink can be applied to one side of the web by a printing station prior to or part of the first rotary microscale structure formation unit, and the array of light focusing elements embossed into the one or more patches. The one or more patches may be formed from clear, UV curable ink. One or more UV curing lamps can be used to fix the UV curable ink after embossing the array of light focusing elements.

The first microscale structure can take a variety of firms, including lenticular micro lenses, spherical micro lenses, spherical micro mirrors, lenticular mirrors, diffractive zone plates and Fresnel lenses.

The first rotary microscale structure formation unit can include a roller, and the focusing elements can be embossed via a shim mounted to the roller. Alternatively, the focusing elements can be embossed via an embossing structure engraved in a surface of the first roller.

In other embodiments, the focusing elements (e.g. DZPs) can printed at the first rotary microscale structure formation unit.

In one or more embodiments, the first rotary microscale structure formation unit includes a first flexographic printing unit for printing coloured ink to form the focusing elements.

Ink can be applied to on one side of the web at a printing station prior to or part of first rotary microscale structure formation unit, and the coloured ink subsequently printed onto the ink to form the focusing elements.

One or more patches of ink can be applied to one side of the substrate, and combined light focusing elements and ink printed onto the one or more patches. The one or more patches may be formed from clear, UV curable ink.

One or more UV curing lamps can be used to fix the UV curable ink after embossing the light focusing elements.

When the focusing elements are printed, the first microscale structure may form any one or more of a binary or multilevel diffractive zone plate, lenticular micro lenses, spherical micro lenses, spherical micro mirrors, lenticular mirrors, and Fresnel lenses.

First Microscale Structure Forms an Array of Image Elements

The first microscale structure may alternatively form an array of image elements. The image elements may be printed on the web of material at the first rotary microscale structure formation unit.

In that regard, the first rotary microscale structure formation unit includes a first flexographic printing unit for printing coloured ink to form the image elements. Ink may be applied to one side of the web at a printing station prior to or part of first rotary microscale structure formation unit, and the coloured ink subsequently printed onto the ink to form the image elements.

One or more patches can by applied at a printing station prior to or part of the first rotary microscale structure formation unit to one side of the substrate, and the combined image elements and ink printed onto the one or more patches. The one or more patches are formed from clear, UV curable ink. One or more UV curing lamps can be used to fix the UV curable ink after printing the array of image elements.

The image elements can be printed via a shim forming part of the first flexographic printing unit.

Second Microscale Structure Forms an Array of Light Focusing Elements

The second microscale structure may forms an array of light focusing elements. The focusing elements (e.g. micro lenses) may be embossed at the second rotary microscale structure formation unit.

One or more patches may be applied to an opposite side of the substrate to the first microscale structure, at a printing station prior to or part of the second rotary microscale structure formation unit. The focusing elements may be embossed into the one or more patches. The one or more patches may be formed from clear, UV curable ink.

The printing station is a gravure printing unit, and one or more UV curing lamps may be used to fix the UV curable ink after embossing the array of light focusing elements.

In one or more embodiments, the second microscale structure can have a variety of forms, including lenticular micro lenses, spherical micro lenses, spherical micro mirrors, lenticular mirrors, diffractive zone plates and Fresnel lenses.

The second rotary microscale structure formation unit can a first roller, and the focusing elements is embossed via a shim mounted to the first roller. Alternatively, the focusing elements can embossed via an embossing structure engraved in a surface of the first roller. The substrate may be is at least partially transparent.

As an alternative to embossing, the focusing elements (e.g. DZPs) can be printed at the second rotary microscale structure formation unit on the web of material.

The second rotary microscale structure formation unit can include a first flexographic printing unit for printing coloured ink to form the focusing elements.

Ink may be applied on one side of the web at a printing station prior to or part of second rotary microscale structure formation unit, and the coloured ink subsequently printed onto the ink to form the focusing elements. The ink may be coloured.

One or more patches may be applied to one side of the substrate, and the combined light focusing elements and ink printed onto the one or more patches. The one or more patches are formed from clear, UV curable ink. One or more UV curing lamps to fix the UV curable ink after embossing the array of light focusing elements.

In one or more embodiments, the second microscale structure forms any one or more of a binary or multilevel diffractive zone plate, lenticular micro lenses, spherical micro lenses, spherical micro mirrors, lenticular mirrors, and Fresnel lenses.

Second Microscale Structure Forms an Array of Image Elements

Alternatively, the second microscale structure may form an array of image elements. The image elements may be printed at the second rotary microscale structure formation unit.

The second rotary microscale structure formation unit may include a second flexographic printing unit for printing coloured ink to form the image elements.

Ink may be applied on one side of the web at a printing station prior to or part of second rotary microscale structure formation unit, and the coloured ink subsequently printed onto the ink to form the image elements. The ink may be coloured.

In one or more embodiments, the web of material includes a substrate, and the process further includes the step of:

One or more patches may be applied at a printing station prior to or part of the second rotary microscale structure formation unit to one side of the substrate, and the combined image elements and ink printed onto the one or more patches. The one or more patches may be formed from clear, UV curable ink. One or more UV curing lamps may be used to fix the UV curable ink. The image elements may be printed via a shim forming part of the first flexographic printing unit.

Double Sided Integrated Devices

It should also be appreciated that whilst two inline microstructure formation units, and associated machinery and processes, is described, it is envisaged that more than two microstructure formation units are capable of being configured inline. Taking the example of FIG. 1, which could equally be applied to other embodiments, two of apparatus 10 can be configure inline with each other, and other "standard" printing unit. In this manner, two layers of microstructures can be applied to each side of the web of material. For example, a first apparatus 10 could apply first imagery on a first side and second imagery on a second side, and a second apparatus 10 could apply first lenses on the first side, for viewing the second imagery, over the first imagery, and second lenses on the second side, for viewing the first imagery, over the second imagery.

Where any or all of the terms "comprise", "comprises", "comprised" or "comprising" are used in this specification (including the claims) they are to be interpreted as specifying the presence of the stated features, integers, steps or components, but not precluding the presence of one or more other features, integers, steps or components.

It will be understood that the invention is not limited to the specific embodiments described herein, which are provided by way of example only. The scope of the invention is as defined by the claims appended hereto.

What is claimed is:

1. An inline apparatus for manufacturing a two-sided product with an integrated device on a web of material, including:
   a first rotary microscale structure formation unit having a first structure configured to form a first microscale structure on one side of a portion of web;
   a second rotary microscale structure formation unit having a second structure configured to form a second microscale structure on a second side of the portion of the web, the first and second microscale structures and the portion of the web between the first and second microscale structures together forming the integrated device, wherein the second structure includes an image area and a non-image area, wherein one or more ink-housing recesses are formed in the non-image area and ink housing recesses are omitted from the image area, such that the second rotary microscale structure formation unit acts to print a negative or reverse image; and
   a web feed system for feeding the web of material between the first and second rotary microscale structure formation units,
   wherein the second rotary microscale structure formation unit includes a second roller, the second structure being formed in a surface of the second roller, or the second roller has a second shim mounted thereto, and the second structure being formed into a surface of the second shim, and
   the second rotary microscale structure formation unit comprises a second ink application unit having a plurality of patches of radiation curable ink disposed on a surface of the second ink application unit and configured to apply the plurality of patches of the radiation curable ink to the second structure such that the radiation curable ink is disposed in the one or more ink-housing recesses.

2. The inline apparatus according to claim 1, wherein the first rotary microscale structure formation unit includes a first roller and the first structure being formed in a surface of the first roller, or the first roller has a first shim mounted thereto, and the first structure being formed into a surface of the first shim.

3. The inline apparatus according to claim 2, wherein the first rotary microscale structure formation unit prints the first microscale structure on the web and/or the second rotary microscale structure formation unit prints the second microscale structure on the web.

4. The inline apparatus according to claim 3, wherein the first rotary microscale structure formation unit includes a first ink application unit, configured to apply a radiation curable ink.

5. The inline apparatus according to claim 4, wherein the first roller rotates the radiation curable ink such that the radiation curable ink is brought into contact with a portion of the web.

6. The inline apparatus according to claim 4, further including:
   one or more first radiation curing means configured to fix the radiation curable ink when the radiation curable ink is in contact with the portion of the web to form the first microscale structure.

7. The inline apparatus according to claim 4, wherein the radiation curable ink is coloured.

8. The inline apparatus according to claim 1, wherein the first and/or the second microscale structures are formed as discrete patches on the web.

9. The inline apparatus according to claim 1, further including:
   a first printing station located prior to or forming part of the first rotary microscale structure formation unit configured to apply a radiation curable ink to one side of the web and emboss the first structure into the radiation curable ink to form the first microscale structure, said first printing station being a gravure printing unit and further including one or more first radiation curing means for fixing the radiation curable ink after, or during, embossing the first structure.

10. The inline apparatus according to claim 1, further including:
    a second printing station located prior to or forming part of the second rotary microscale structure formation unit configured to apply a radiation curable ink to one side of the web and emboss the second microscale structure into the radiation curable ink, said second print station being a gravure printing unit and further including one or more second radiation curing means for fixing the radiation curable ink after, or during, embossing the second structure.

11. The inline apparatus according to claim 1, wherein the second roller rotates the radiation curable ink such that the radiation curable ink is brought into contact with the portion of the web.

12. The inline apparatus according to claim 1, further including:
    one or more second radiation curing means configured to fix the radiation curable ink when in contact with the portion of the web to form the second microscale structure.

13. The inline apparatus according to claim 1, further including:
    a detector configured to detect one or more registration marks or devices formed by the first and second rotary microscale structure formation units, components of the first and second rotary microscale structure formation unit, one or more additional microscale structure formation units or components of one or more additional microscale structure formation units; and
    a controller configured to:
      determine a registration error, and
      control a registration compensation system to compensate determined registration error.

14. The inline apparatus according to claim 1, wherein the web travels in a machine direction though the apparatus, the apparatus further including:
    a linear compensator to control registration in the machine direction, including an idler roller adapted to be driven transverse to the machine direction and to a plane of the web to increase or decrease web length between the first and second microscale structure formation units, and
    an edge guide to control registration transverse to the machine direction and in the plane of the web by moving the web sideways between its edges.

15. The inline apparatus according to claim 14, wherein the first and second rotary microscale structure formation units and/or one or more additional microscale structure formation units each include a main drum over which the web passes, the apparatus further including a skew compensation means to adjust the relative skew angle between the web and the relevant microscale formation unit, wherein the skew compensation means includes:
    a skew roller prior to at least one of the main drums; and a skew compensator to compensate for web skew by controlling relative pivoting between the skew roller and the main drum to alter web entry angle at the at least one main drum.

16. The inline apparatus according to claim 1, further including:
an automated shim mounting machine to automatically mount shims to form the microscale structures to desired tolerances, and/or a roller temperature control system including:
heat exchanger configured to transfer heat between rollers in one or both to the first and second microscale structure formation units and a cooling fluid;
one or more temperature measuring devices configured to measure the temperature of the rollers; and
a control system configured to control operation of the heat exchanger in response to the temperature detected by the one or more temperature measuring devices, and/or an ink temperature control system configured to control the temperature of the radiation curable ink including:
one or more ink storage tanks;
a heat exchanger configured to transfer heat between the ink storage tanks and a cooling fluid;
one or more temperature measuring devices configured to measure the temperature of the ink; and
a control system configured to control operation of the heat exchanger in response to the temperature detected.

17. The inline apparatus according to claim 1, wherein the radiation curable ink is coloured.

18. The inline apparatus according to claim 1, wherein the plurality of patches are spaced apart from each other on the second structure.

19. An inline apparatus for manufacturing a two-sided product with an integrated device on a web of material, including:
a first rotary microscale structure formation unit having a first structure configured to form a first microscale structure on one side of a portion of web;
a second rotary microscale structure formation unit having a second structure configured to form a second microscale structure on a second side of the portion of the web, the first and second microscale structures and the portion of the web between the first and second microscale structures together forming the integrated device, wherein the second structure includes an image area and a non-image area, wherein one or more ink-housing recesses are formed in the non-image area and ink housing recesses are omitted from the image area, such that the second rotary microscale structure formation unit acts to print a negative or reverse image; and
a web feed system for feeding the web of material between the first and second rotary microscale structure formation units,
wherein the second rotary microscale structure formation unit includes a second roller, the second structure being formed in a surface of the second roller, or the second roller has a second shim mounted thereto, and the second structure being formed into a surface of the second shim, and
the second rotary microscale structure formation unit comprises a second ink application unit configured to apply a radiation curable ink to the second structure such that the radiation curable ink is disposed in the one or more ink-housing recesses,
wherein the second ink application unit is a flexographic printing unit.

* * * * *